(12) United States Patent
Okada et al.

(10) Patent No.: US 8,039,378 B2
(45) Date of Patent: Oct. 18, 2011

(54) METHOD OF MANUFACTURING A SEMICONDUCTOR DEVICE

(75) Inventors: Shigenari Okada, Tokyo (JP); Takuya Futase, Tokyo (JP); Yutaka Inaba, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 83 days.

(21) Appl. No.: 12/358,584

(22) Filed: Jan. 23, 2009

(65) Prior Publication Data

US 2009/0191707 A1     Jul. 30, 2009

(30) Foreign Application Priority Data

Jan. 25, 2008   (JP) .................... 2008-014408

(51) Int. Cl.
*H01L 21/44* (2006.01)
(52) U.S. Cl. ........ 438/582; 438/630; 438/648; 438/650; 438/682; 438/685; 257/388; 257/455; 257/456; 257/576; 257/757; 257/E21.006; 257/E21.593
(58) Field of Classification Search .......... 438/581–583, 438/630, 648–649, 650–652, 655, 664, 682–683, 438/685–686; 257/388, 412, 455, 465, 576, 257/757, 768, 769, E21.006, E21.593
See application file for complete search history.

(56) References Cited

U.S. PATENT DOCUMENTS

| 6,218,249 | B1 | 4/2001 | Maa et al. | |
| 2001/0012666 | A1* | 8/2001 | Hsu ................. | 438/286 |
| 2002/0090757 | A1* | 7/2002 | Komori ............... | 438/110 |
| 2002/0132473 | A1* | 9/2002 | Chiang et al. ............ | 438/643 |
| 2006/0014387 | A1* | 1/2006 | Robertson et al. ........... | 438/682 |
| 2007/0093047 | A1 | 4/2007 | Okuno et al. | |
| 2007/0161197 | A1 | 7/2007 | Matsuda et al. | |
| 2009/0155999 | A1* | 6/2009 | Chen et al. ................. | 438/664 |

FOREIGN PATENT DOCUMENTS

| JP | 5-29343 A | 2/1993 |
| JP | 11-251591 A | 9/1999 |
| JP | 2007-142347 A | 6/2007 |
| JP | 2007-184420 A | 7/2007 |

* cited by examiner

*Primary Examiner* — Matthew Smith
*Assistant Examiner* — Su Kim
(74) *Attorney, Agent, or Firm* — Miles & Stockbridge P.C.

(57) ABSTRACT

To provide a technique capable of improving the reliability of a semiconductor element and its product yield by reducing the variations in the electrical characteristic of a metal silicide layer. After forming a nickel-platinum alloy film over a semiconductor substrate 1, by carrying out a first thermal treatment at a thermal treatment temperature of 210 to 310° C. using a heater heating device, the technique causes the nickel-platinum alloy film and silicon to react with each other to form a platinum-added nickel silicide layer in a $(PtNi)_2Si$ phase. Subsequently, after removing the unreacted nickel-platinum alloy film, the technique carries out a second thermal treatment having the thermal treatment temperature higher than that of the first thermal treatment to form the platinum-added nickel silicide layer in a PtNiSi phase. The temperature rise rate of the first thermal treatment is set to 10° C./s or more (for example, 30 to 250° C./s) and the temperature rise rate of the second thermal treatment is set to 10° C./s or more (for example, 10 to 250° C./s).

16 Claims, 25 Drawing Sheets

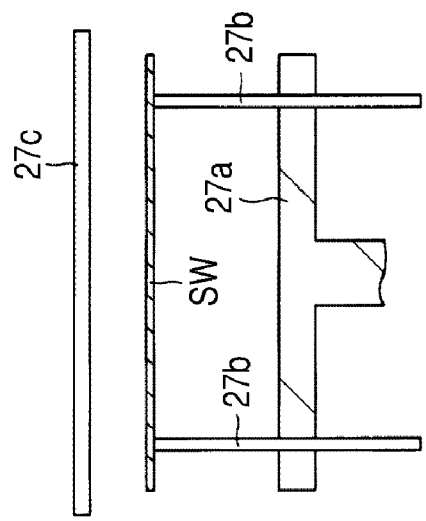
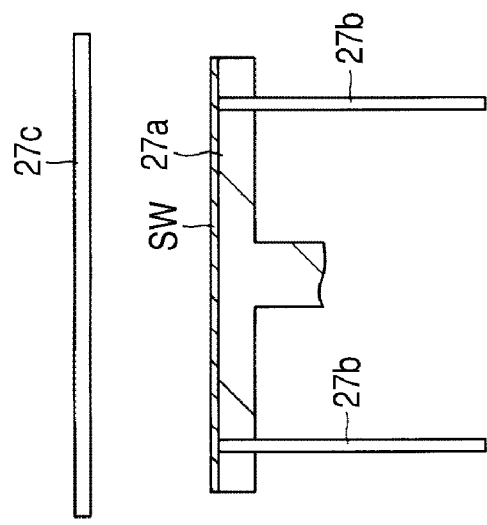
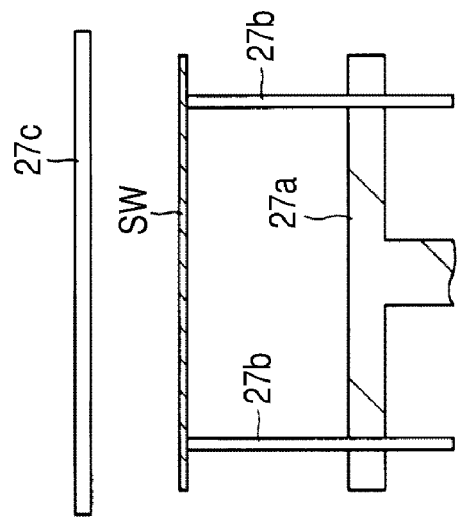

Soak (2nd RTA: 550°C 30s)

Spike (2nd RTA: 590°C 0s)

METHOD OF MANUFACTURING A SEMICONDUCTOR DEVICE

CROSS-REFERENCE TO RELATED APPLICATION

The present application claims priority from Japanese patent application No. 2008-14408 filed on Jan. 25, 2008, the content of which is hereby incorporated by reference into this application.

BACKGROUND OF THE INVENTION

The present invention relates to a manufacturing technique of a semiconductor device and more particularly to a technique which is useful for the application to the manufacture of a semiconductor element having a metal silicide layer.

With the progress of high integration of a semiconductor device, a field effect transistor is miniaturized in accordance with the scaling law, however, there arises a problem that a high-speed operation cannot be obtained even if the field effect transistor is miniaturized because the resistance of a gate, source, and drain increases. Consequently, for example, for a field effect transistor having a gate length of 0.2 μm or less, a SALICIDE (Self Aligned Silicide) technique is under study, which reduces the resistance of a gate, source, and drain by forming a silicide layer with a low resistance, for example, such as a nickel silicide layer and cobalt silicide layer, over the surface of a conductive film constituting a gate and a semiconductor region constituting a source and drain by means of self-alignment.

For example, in Japanese patent laid-open No. 11-251591 (patent document 1), a technique is disclosed, which forms a silicide layer with a low resistance by, after forming a silicide compound rich in metal by carrying out first annealing of a metal film including Ni, Co, Mo, Ta, W, Cr, Pt, or Pd, removing unreacted metal film and by further carrying out second annealing of the silicide compound.

In Japanese patent laid-open No. 2007-184420 (patent document 2), a technique is described, which forms a silicide by, after forming a metastable Ni silicide by annealing a silicon substrate in which Ni is formed as a first sinter at temperatures not lower than 250° C. and not higher than 500° C., removing unreacted Ni and further annealing as a second sinter at temperatures higher than those of the first sinter to cause Ni and Si to react each other.

In Japanese patent laid-open No. 5-29343 (patent document 3), a technique is described, which forms a silicide film by, after forming a titanium silicide film by annealing Ti for a brief time in the atmosphere of $N_2$ at 600° C., removing a titanium nitride layer and titanium layer and further injecting a silicon ion beam once or more, and then annealing in the atmosphere of $N_2$ at about 800° C.

In Japanese patent laid-open No. 2007-142347 (patent document 4), a technique is described, which carries out a thermal treatment after sequentially depositing a nickel alloy film and a nickel film over a semiconductor substrate in a step of forming a nickel alloy silicide layer over at least one of a gate electrode and a source/drain region.

[Patent document 1]
Japanese patent laid-open No. 11-251591
[Patent document 2]
Japanese patent laid-open No. 2007-184420
[Patent document 3]
Japanese patent laid-open No. 5-29343
[Patent document 4]
Japanese patent laid-open No. 2007-142347

A nickel silicide layer in a mono metal silicide (NiSi) phase has a low resistance of 14 to 20μΩ·cm, and can be formed by the SALICIDE technique at comparably low temperatures, for example, 400 to 600° C. Consequently, the formation of a shallow junction with a low resistance is made possible, and therefore, a nickel silicide layer is adopted recently for the source/drain of a field effect transistor required to be miniaturized.

For the formation of the nickel silicide layer in the NiSi phase, thermal treatment in two stages is used generally. First, in order to deposit a nickel film over a wafer to form the NiSi phase, a first thermal treatment is carried out. As conditions on the first thermal treatment, for example, a temperature of 410° C., a time of 30 seconds, and a temperature rise rate of 5° C./s can be enumerated.

For the first thermal treatment, for example, a lamp heating device 101 shown in FIG. 30 can be used. FIGS. 30(a), 30(b), and 30(c) are respectively a plan view of a general configuration of the lamp heating device, a section view of essential parts in a chamber, and a plan view of essential parts of a susceptor part.

As shown in FIG. 30(a), a wafer is accommodated in a FOUP 102 docked to the lamp heating device 101. The wafer taken out from the FOUP 102 is transferred to a load lock 103. In order to suppress outside air (mainly oxygen) from entering a processing chamber 105 mixedly, the interior of the load lock 103 is temporarily depressurized to 133.32 Pa or less and then its pressure is restored to the atmospheric pressure. After that, the wafer is transferred to one of the processing chambers 105 via a transfer chamber 104 etc. Before a first wafer is transferred to the processing chamber 105, the chamber 105 is heated and the oxygen remaining in the chamber 105 is thermally discharged. The wafer having been subjected to a predetermined thermal treatment is cooled down, returned to the transfer chamber 104, and then returned to the FOUP 102 via the load lock 103.

As shown in FIGS. 30(b) and 30(c), a wafer SW is heated from the side of a wafer surface SWs by infrared radiation of a halogen lamp 106 installed in the processing chamber 105. The outputs of the 409 halogen lamps 106 in the processing chamber 105 are controlled while the wafer temperature is being read from the side of a wafer rear surface SWr using pyrometers 107. The pyrometers 107 are arranged from the wafer center toward the periphery and read the temperature in the wafer plane and feed it back to the power of the halogen lamp 106 in the zone corresponding to the position of each pyrometer 107.

However, variations in temperature in the wafer plane are caused because (1) the number of halogen lamps 106 is large and therefore there is a difference in the amount of heat radiated from among the halogen lamps 106, (2) the heating in the wafer plane is not uniform due to a small difference in horizontality between the halogen lamp 106 and a susceptor (Edge Ring) 108 that holds the wafer SW, etc. It is possible to reduce the variations in temperature in the wafer plane by rotating the wafer SW to suppress the above-mentioned phenomenon. However, because the outermost periphery of the wafer SW comes into contact with the entire surface of the susceptor 108, the temperature of the wafer periphery is impeded from rising and in particular, until a temperature zone (about 280° C.) where control is possible is reached, the variations in temperature in the wafer plane are likely to be caused.

After the first thermal treatment, the unreacted nickel film is removed and a second thermal treatment for stabilizing the NiSi phase is further carried out. As the conditions on the second thermal treatment, for example, a temperature of 550° C., a time of 30 seconds, and a temperature rise rate of 3 to 10° C./s can be enumerated.

Table 6 shows an example of a process recipe of the second thermal treatment. In the second thermal treatment also, the lamp heating device 101 shown in FIG. 30 described above can be used. First, a small amount of heat (lamp power 5%) is given to the processing chamber 105 (Step No. 1) and a standby state is maintained until the concentration of oxygen in the processing chamber 105 becomes 5 ppm or less (Step No. 2). Then, the wafer SW is transferred to the processing chamber 105. Following this, the power to be input to the halogen lamp 106 is set to raise the temperature of the wafer SW at a low rate and the wafer SW is heated until a temperature zone (about 280° C.) is reached, where the temperature of the wafer can be read and the control of the wafer temperature becomes possible (Step No. 3). As described above, the wafer SW is heated by the infrared radiation of the halogen lamp 106, and therefore, the variations in temperature in the wafer plane are likely to be caused in a low-temperature range, such as a range of temperatures between room temperature and about 280° C. Consequently, a step (Step No. 4) is provided, in which the temperature is raised at a low rate in order to reduce the variations in temperature in the wafer plane in this temperature zone. Subsequently, the temperature of the wafer SW is kept at a constant temperature (300° C.) and after the variations in temperature in the wafer plane are controlled (Step No. 5), the temperature of the wafer SW is raised to a thermal treatment temperature (550° C.) (Steps No. 6, No. 7), and the second thermal treatment is carried out (Step No. 8). After the second thermal treatment is completed, the supply of power to the halogen lamp 106 is returned to that in the standby state and the temperature of the wafer SW is reduced (Step No. 9).

the temperature of the wafer SW is kept at a constant temperature (300° C.) is 20 to 30 seconds (Steps No. 4, No. 5) and further, the time required until the temperature is raised to the thermal treatment temperature is about 15 seconds (Steps No. 6, No. 7), and thus, an excessive amount of heat corresponding to the period of time of about 40 seconds is applied to the wafer SW besides the thermal treatment (Step No. 8). Further, before an insulating film is formed over the nickel silicide layer, the surface of the nickel silicide layer is subjected to the plasma cleaning process and the change in composition of NiSi due to the plasma cleaning process is one of the causes of the occurrence of defects. Since the plasma cleaning technique is disclosed in Japanese Patent Application No. 2007-259355 (filed on Oct. 3, 2007), duplicated parts are not repeated here as a general rule.

Because of such circumstances, the present inventors have studied a nickel silicide layer to which platinum is added (hereinafter, referred to simply as platinum-added nickel silicide layer) in order to reduce the defects on the surface of the above-mentioned nickel silicide layer. However, it has been revealed that, when forming a platinum-added nickel silicide layer, the temperature of the first thermal treatment of the thermal treatment in two stages is the temperature zone (about 280° C.) where the wafer temperature can be read and controlled and it is difficult to stably carry out the first thermal treatment to form the platinum-added nickel silicide layer in the mono metal silicide (PtNiSi) phase. Further, in the first thermal treatment, because the wafer SW is heated by the infrared radiation of the halogen lamp 106, it takes time to raise the temperature to the thermal treatment temperature (about 280° C.) and therefore an excessive amount of heat is applied to the wafer. As a result, the platinum-added nickel silicide layer after the first thermal treatment includes not only the PtNiSi phase but also a plurality of phases other than

TABLE 6

| | Step No. | | | | | | | |
|---|---|---|---|---|---|---|---|---|
| | 1 | 2 | 3 | 4 | 5 | 6 | 7 | 8 |
| Step Name | PURGE | O2 CHECK | OL | SOR | STAB | RAMP UP | RAMP UP2 | SOAK |
| To Next Step | TIME | O2 < 5 ppm | TEMP > 280 | SETP THERE | TIME | SETP THERE | SETP THERE | TIME |
| Time | 20 | 20 | 20 | 5 | 15 | 10 | 5 | 30 |
| Setting | CONST. V | CONST. V | RAMP V | RAMP TEMP | STAB TEMP | RAMP TEMP | RAMP TEMP | CONST. TEMP |
| Temp. | 5% | — | — | 280-300 | 300 | 300-535 | 535-550 | 550 |
| Temp Ramp Rate | — | — | 0.1%/s | 5° C./s | — | 20° C./s | 3° C./s | — |
| N2 | 15 | 15 | 15 | 15 | 15 | 15 | 15 | 15 |
| He | 1.5 | 1.5 | 1.5 | 1.5 | 1.5 | 1.5 | 1.5 | 1.5 |
| Rot. | — | 45 | 240 | 240 | 240 | 240 | 240 | 240 |

However, about the nickel silicide layer formed by the SALICIDE technique, there are various technical problems to be described below.

That is, it has been revealed that there are many defects on the surface of the nickel silicide layer in the NiSi phase formed by the thermal treatment in the two stages described above and variations in electrical characteristics are caused. This may result from aggregation of Ni and Si due to the application of an excessive amount of heat to the wafer in the second thermal treatment carried out to stabilize the NiSi phase. As described above using Table 6, in the second thermal treatment, after the wafer is heated until a temperature zone (about 280° C.) is reached, where the wafer temperature can be read and controlled, the period of time during which the PtNiSi phase, resulting in variations in resistance values of the platinum-added nickel silicide layer. In addition, because the lower limit temperature above which the wafer temperature can be controlled is adopted, it is not possible to increase the temperature rise rate. Furthermore, it has been revealed that the reduction in defects on the surface of the platinum-added nickel silicide layer formed by the thermal treatment in two stages is small and a remarkable effect of the addition of platinum cannot be obtained.

SUMMARY OF THE INVENTION

An object of the present invention is to provide a technique capable of improving the reliability and product yield of a semiconductor element by reducing variations in electrical characteristics of a metal silicide layer.

Another object of the present invention is to provide a technique capable of improving throughput in a manufacturing process of a semiconductor element having a metal silicide layer.

The above and further objects and novel features of the invention will more fully appear from the following detailed description in this specification and the accompanying drawings.

Preferred embodiments of the invention which will be disclosed herein are briefly outlined below.

The present embodiment is a method of manufacturing a semiconductor device for forming a silicide layer with a low resistance over the surface of a gate electrode and a source/drain region of a field effect transistor by a self-alignment method. The method, first, after forming a gate insulating film, a gate electrode, and a source/drain region of a field effect transistor over a semiconductor substrate made of single crystal silicon, forms an alloy film of nickel and platinum over the semiconductor substrate. The method then, by carrying out a first thermal treatment at a thermal treatment temperature of 210 to 310° C. using a heater heating device, causes the alloy film and silicon constituting the gate electrode or source/drain region to react with each other to form a platinum-added nickel silicide layer in a (PtNi)$_2$Si phase, then after removing the unreacted alloy film, by carrying out a second thermal treatment at a thermal treatment temperature higher than that of the first thermal treatment, forms a platinum-added nickel silicide layer in a PtNiSi phase. The temperature rise rate of the first thermal treatment is set to 10° C./s or more (for example, 30 to 250° C./s) and the temperature rise rate of the second thermal treatment is set to 10° C./s or more (for example, 10 to 250° C./s).

The present embodiment is a method of manufacturing a semiconductor device for forming a silicide layer with a low resistance over the surface of a gate electrode and a source/drain region of a field effect transistor by a self-alignment method. The method, first, after forming a gate insulating film, a gate electrode, and a source/drain region of a field effect transistor over a semiconductor substrate made of single crystal silicon, forms an alloy film of nickel and platinum over the semiconductor substrate. The method then, by carrying out a first thermal treatment at a thermal treatment temperature of 380 to 400° C. using a heater heating device, causes the alloy film and silicon constituting the gate electrode or source/drain region to react with each other to form a platinum-added nickel silicide layer in a PtNiSi phase, then after removing the unreacted alloy film, by carrying out a second thermal treatment at a thermal treatment temperature higher than that of the first thermal treatment, forms a platinum-added nickel silicide layer in the PtNiSi phase closer to the stoichiometric composition. The temperature rise rate of the first thermal treatment is set to 10° C./s or more (for example, 30 to 250° C./s) and the temperature rise rate of the second thermal treatment is set to 10° C./s or more (for example, 10 to 250° C./s).

The present embodiment is a method of manufacturing a semiconductor device for forming a silicide layer with a low resistance over the surface of a gate electrode and a source/drain region of a field effect transistor by a self-alignment method. The method, first, after forming a gate insulating film, a gate electrode, and a source/drain region of a field effect transistor over a semiconductor substrate made of single crystal silicon, forms a nickel film over the semiconductor substrate. The method then, by carrying out a first thermal treatment, causes the nickel film and silicon constituting the gate electrode or source/drain region to react with each other to form a nickel silicide layer in a NiSi phase, then, after removing the unreacted nickel film, by carrying out a second thermal treatment at a thermal treatment temperature higher than that of the first thermal treatment, forms a nickel silicide layer in the NiSi phase closer to the stoichiometric composition. The temperature rise rate of the second thermal treatment is set to 10° C./s or more (for example, 10 to 250° C./s).

The effect brought about by an embodiment of the invention disclosed herein will be briefly described as follows.

It is possible to improve the reliability and product yield of a semiconductor element by reducing variations in the electrical characteristic of a metal silicide layer. In addition, it is possible to improve throughput in a manufacturing process of a semiconductor element having a metal silicide layer.

BRIEF DESCRIPTION OF THE DRAWINGS

FIGS. 16(a) to 16(c) are schematic section views of a chamber for illustrating a processing process of a semiconductor wafer in a dry cleaning processing chamber included in a device for forming a film of a silicide material according to the first embodiment of the present invention.

DETAILED DESCRIPTION OF THE PREFERRED EMBODIMENTS

Figure 1:
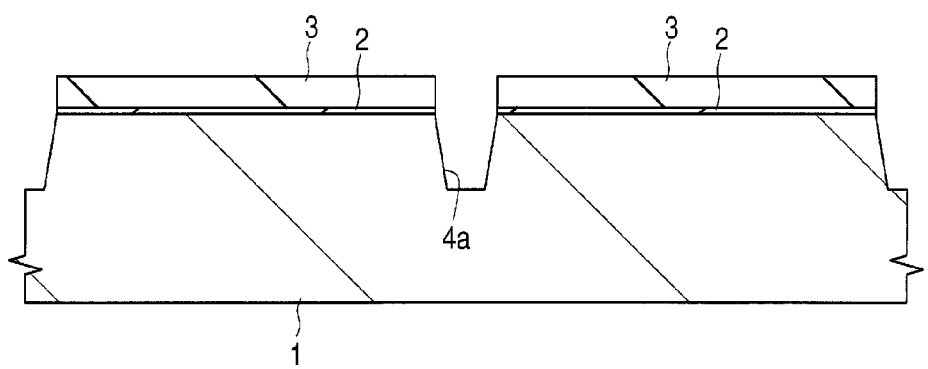
FIG. 1 is a section view of essential parts during the period of manufacture of a CMOS device according to a first embodiment of the present invention.

In the present embodiments, when necessary for the sake of convenience, description is given by dividing an embodiment into a plurality of sections or embodiments, however, except when explicitly stated in particular, the sections or embodiments are not those having nothing to do with each another but one has a relationship with another or all the rest as a variation, detail, supplementary, etc. When the number of elements etc. (including the number of items, numerical value, quantity, range, etc.) is referred to in the present embodiments, except when explicitly stated in particular or when the number is apparently limited to a specific number in principle, the number is not limited to the specific number but may be greater or less than the specific number. Furthermore, it is needless to say that, in the present embodiments, except when explicitly stated in particular or when apparently indispensable in principle, the components (including elementary steps) are not necessarily indispensable. Similarly, it is assumed that, in the present embodiments, when the shapes, positional relationships, etc., of the components etc. are referred to, except when explicitly stated in particular or when they can apparently be thought otherwise in principle, those substantially similar to or resembling the shapes etc. are also included. This also applies to the above-mentioned numerical values and ranges.

In the present embodiments, a MISFET (Metal Insulator Semiconductor Field Effect Transistor) typical of the field effect transistor is abbreviated to MIS, a p-channel type MISFET is abbreviated to pMIS, and an n-channel type MISFET is abbreviated to nMIS. Even if it is described as MOS for convenience, a non-oxidized film is not excluded. In the present embodiments, when a wafer is referred to, it mainly means an Si (Silicon) single crystal wafer, however, not limited to that, it widely includes an SOI (Silicon On Insulator) wafer, an insulating film substrate for forming an integrated circuit thereover, etc. The shape is not limited only to a circle or approximately circular shape, but a square or rectangular shape is also included. It is needless to say that, when a silicon film, silicon part, silicon member, etc., are referred to, except when apparently otherwise or when explicitly stated otherwise, they include not only pure silicon but also those including impurities, alloys including silicon, such as SiGe and SiGeC, as its main component (including distorted silicon), and additives.

It is needless to say, when polycrystalline silicon etc. is referred to, except when apparently otherwise or when explicitly stated otherwise, not only typical ones but also amorphous silicon etc. are also included.

In all of the drawings for use in description of the embodiment, the parts having the same function are assigned the same symbols as a rule and its repeated description will be omitted. Embodiments of the present invention will be described below in detail based on the drawings.

Since the dry cleaning technique is disclosed in Japanese Patent Application No. 2006-107780 (filed on Apr. 10, 2006) and Japanese Patent Application No. 2007-81147 (filed on Mar. 27, 2007) by Futase et al., the duplicated parts are not repeated as a rule.

First Embodiment

Figure 13:
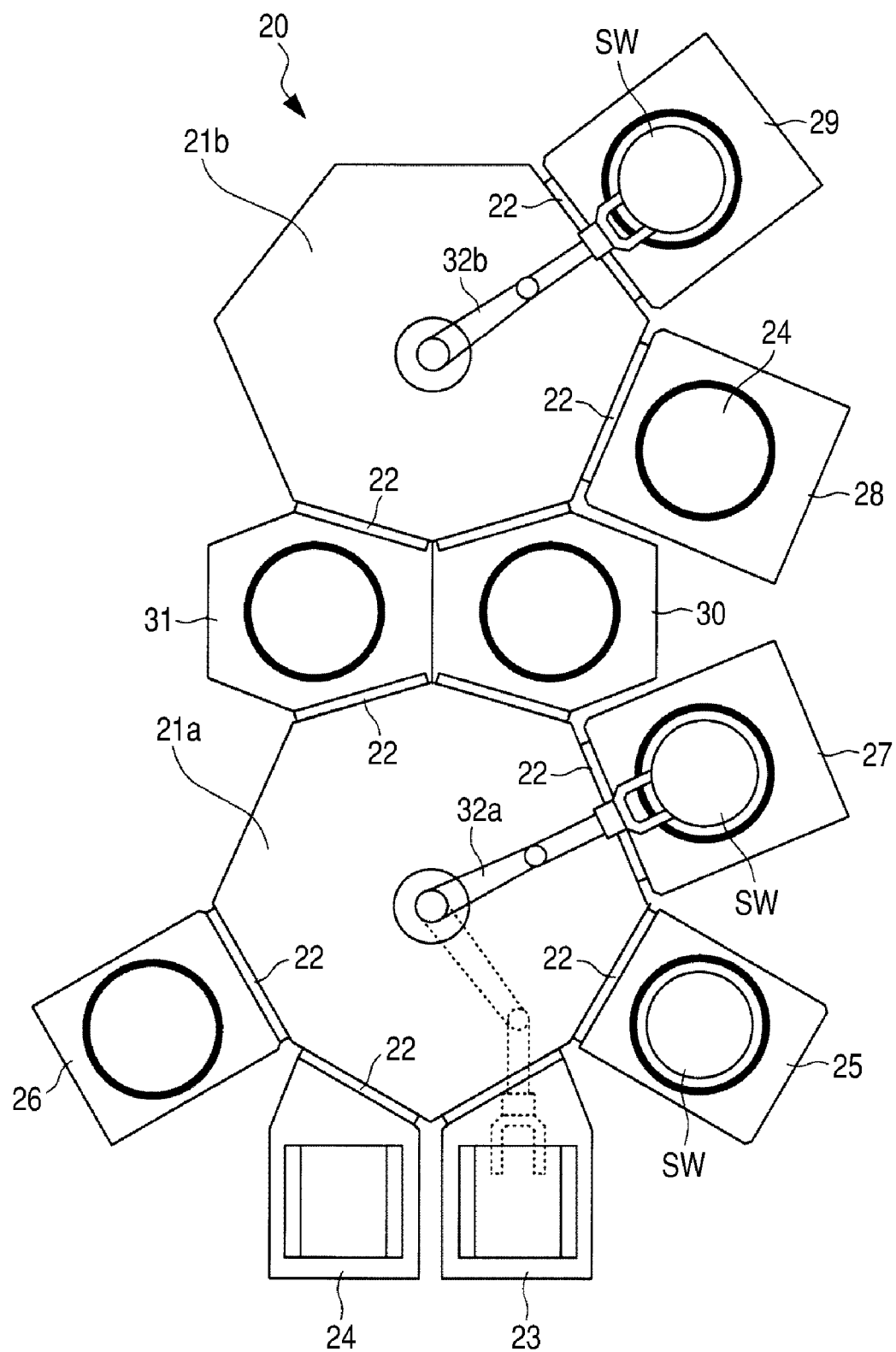
FIG. 13 is a schematic plan view of a device for forming a film of a silicide material according to the first embodiment of the present invention.
Figure 14:
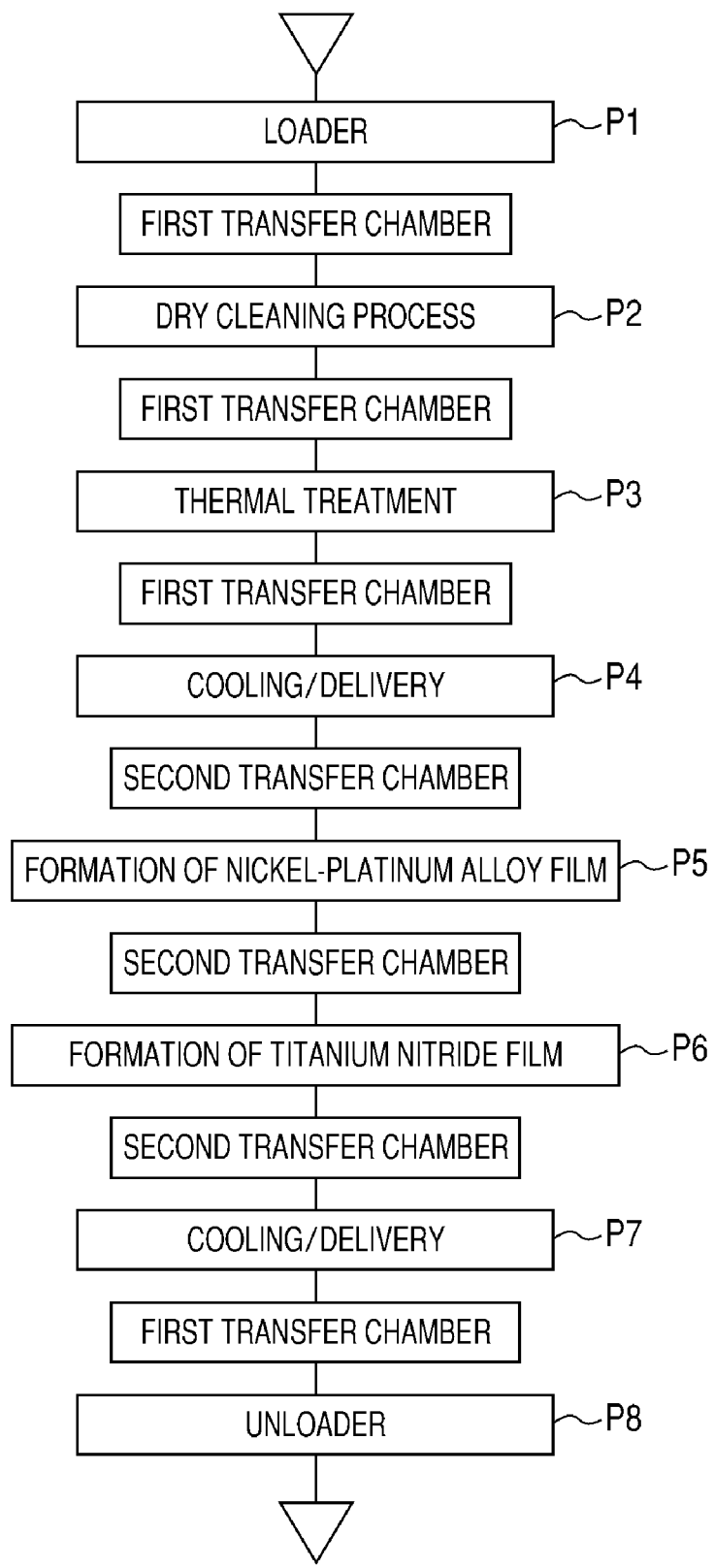
FIG. 14 is a process diagram for forming a film of a silicide material according to the first embodiment of the present invention.
Figure 15:
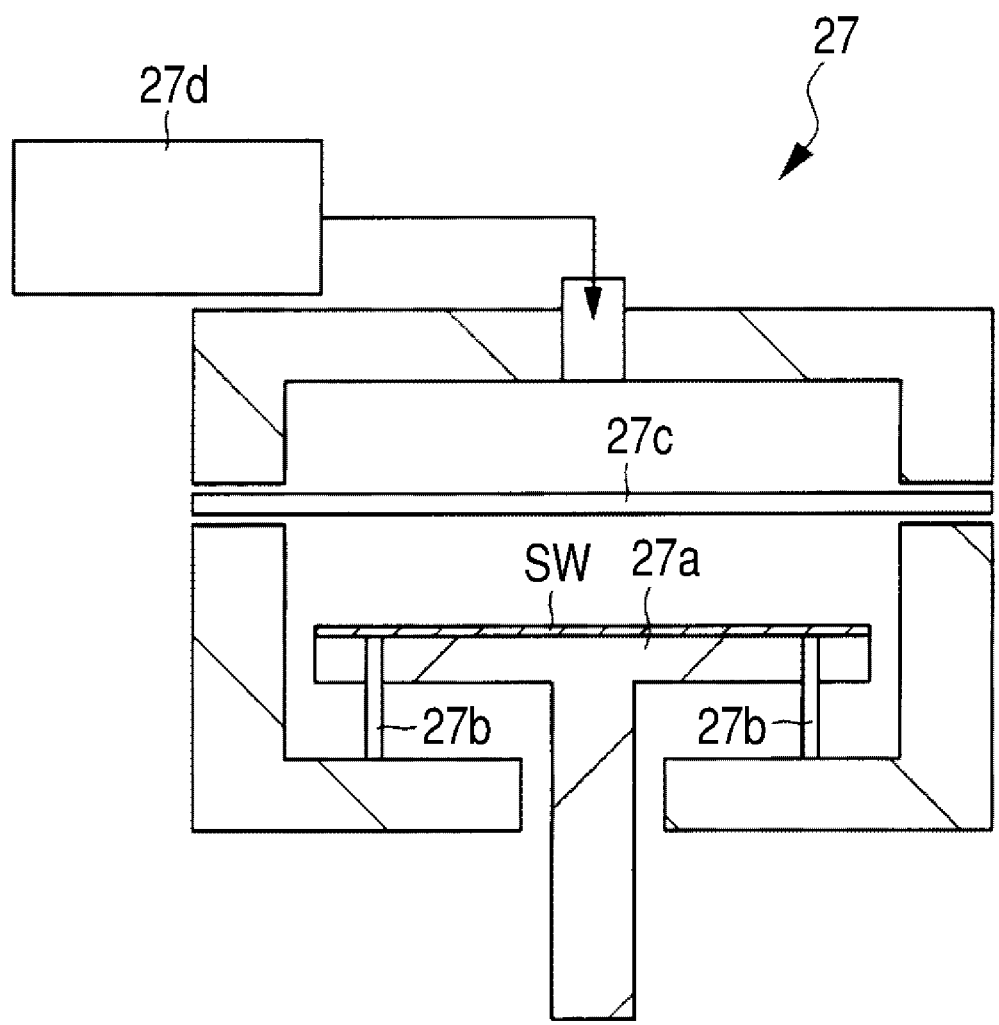
FIG. 15 is a schematic section view of a dry cleaning processing chamber included in a device for forming a film of a silicide material according to the first embodiment of the present invention.
Figure 18:
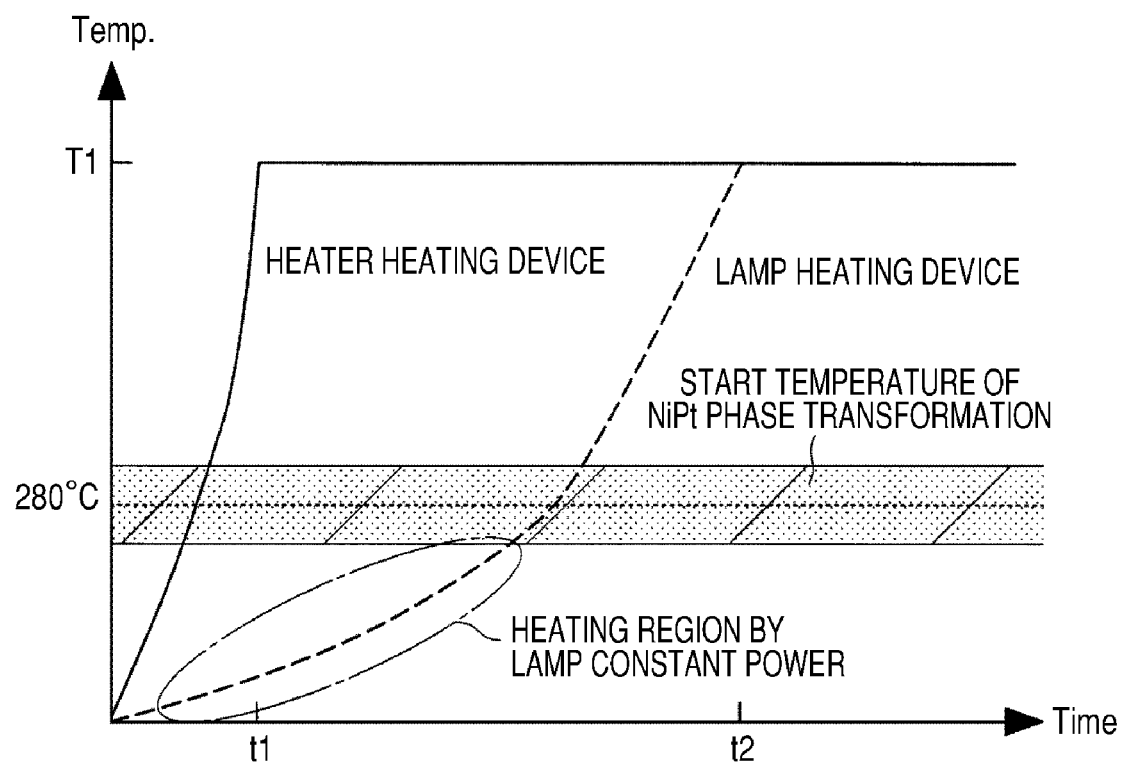
FIG. 18 is a graph diagram for illustrating temperature rise characteristic of a heater heating device and a lamp heating device according to the first embodiment of the present invention.
Figure 19:
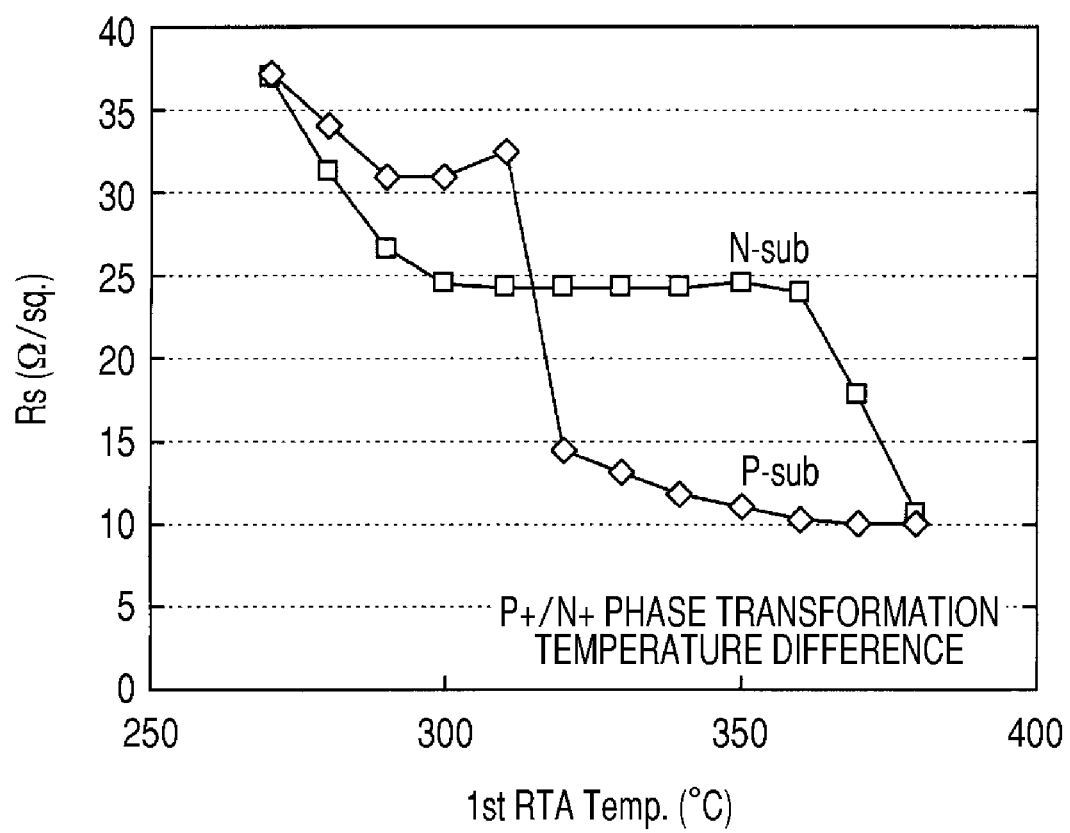
FIG. 19 is a graph diagram for illustrating a relationship between the sheet resistance of a platinum-added nickel silicide layer and the temperature of a first thermal treatment according to the first embodiment of the present invention.

A method of manufacturing a COMS (Complementary Metal Oxide Semiconductor) device according to a first embodiment of the present invention will be described using FIG. 1 to FIG. 25. FIG. 1 to FIG. 10, FIG. 12, FIG. 17, and FIG. 23 to FIG. 25 are section views of essential parts of a CMOS device, FIG. 11 is a manufacturing process flow diagram of a process to form a silicide layer by the SALICIDE technique, FIG. 13 is a schematic plan view of a device for forming a film of a silicide material, FIG. 14 is a process diagram for forming a film of a silicide material, FIG. 15 is a schematic section view of a dry cleaning processing chamber included in the device for forming a film of a silicide material, FIG. 16 is a schematic section view of a chamber for illustrating a processing process of a semiconductor wafer in the dry cleaning processing chamber included in the device for forming a film of a silicide material, FIG. 18 is a graph diagram for illustrating the temperature rise characteristic of a heater heating device and a lamp heating device, FIG. 19 is a graph diagram for illustrating a relationship between the sheet resistance of a platinum-added nickel silicide layer and the temperature of a first thermal treatment, FIG. 20 is a plan view of a general configuration of a heater heating device and a section view of essential parts in a chamber, FIG. 21 is a plan view of essential parts of a susceptor included in the heater heating device and a section view of essential parts thereof, and FIG. 22 is a graph diagram for illustrating the temperature characteristic of a soak anneal process and a spike anneal process.

First, as shown in FIG. 1, a semiconductor substrate (thin semiconductor plate in the form of a substantially planar circle called a semiconductor wafer) 1 made of, for example, p-type single crystal silicon, is prepared. Next, after thermally oxidizing the semiconductor substrate 1 to form a silicon oxide film 2 having a thickness of about 10 nm over the surface thereof, a silicon nitride film 3 having a thickness of, for example, about 100 nm is deposited over the upper layer thereof by the CVD (Chemical Vapor Deposition) method. Subsequently, by dry-etching the silicon nitride film 3, the silicon oxide film 2, and the semiconductor substrate 1 in order sequentially using a resist pattern as a mask, a groove 4a having a depth of about 300 nm is formed in the semiconductor substrate 1 in an element isolation region.

Figure 2:
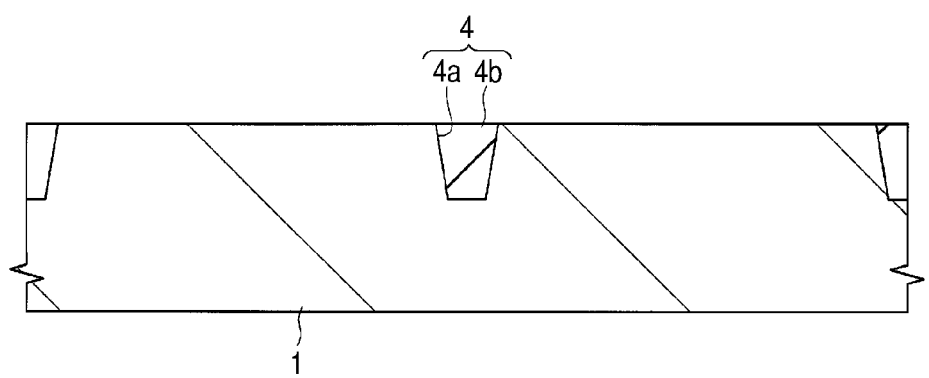
FIG. 2 is a section view of essential parts during the period of manufacture of the CMOS device following FIG. 1.

Next, as shown in FIG. 2, after removing the silicon nitride film 3 by wet etching using a hot phosphoric acid, an insulating film 4b is deposited over the main surface of the semiconductor substrate 1 including the interior of the groove 4a by the CVD method. Subsequently, by polishing the insulating film 4b by the CMP (Chemical Mechanical Polishing) method, an element isolation region 4 is formed by leaving the insulating film 4b inside the groove 4a. Subsequently, subjecting the semiconductor substrate 1 to a thermal treatment at a temperature of about 1000° C. bakes the insulating film 4b embedded in the groove 4a.

Figure 3:
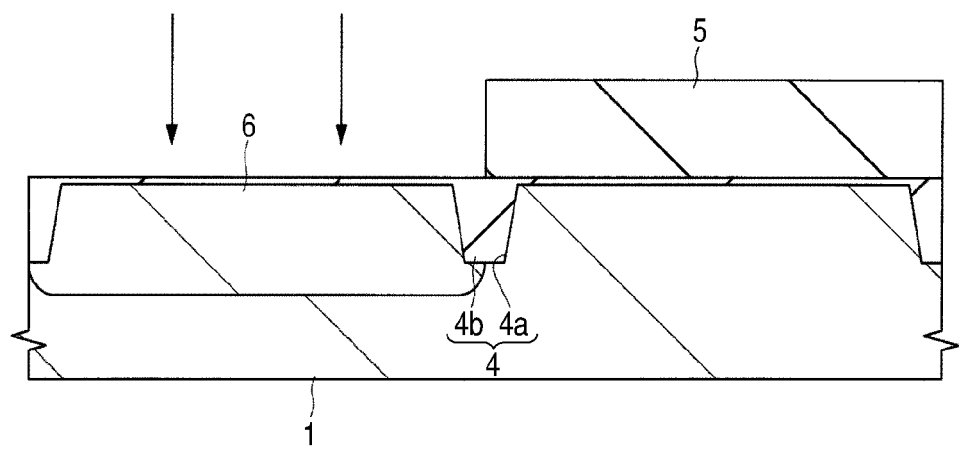
FIG. 3 is a section view of essential parts during the period of manufacture of the CMOS device following FIG. 2.
Figure 4:
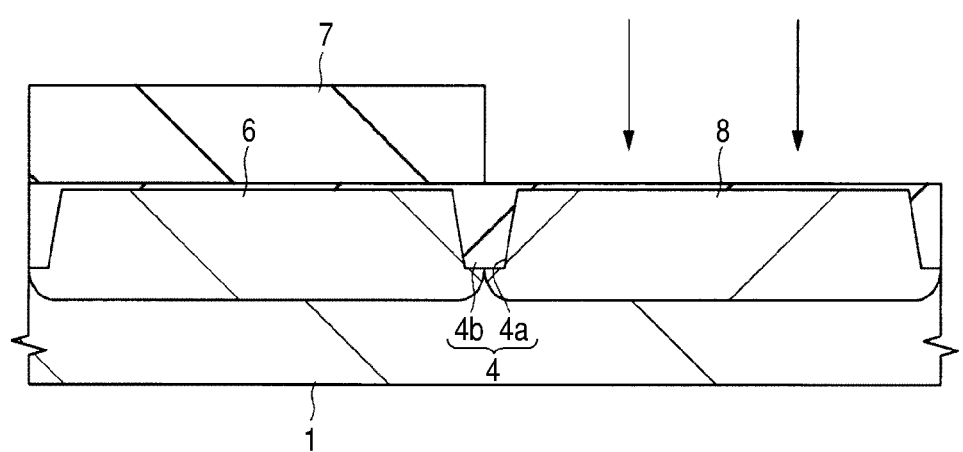
FIG. 4 is a section view of essential parts during the period of manufacture of the CMOS device following FIG. 3.

Next, as shown in FIG. 3, a pMIS formation region is covered with a resist pattern 5 and p-type impurities, for example, boron (B) ions, are ion-implanted in order to form a p-type well 6 in an nMIS formation region of the semiconductor substrate 1. Similarly, as shown in FIG. 4, the nMIS formation region is covered with a resist pattern 7 and n-type impurities, for example, phosphorus (P) or arsenic (As), are ion-implanted in order to form an n-type well 8 in the pMIS formation region of the semiconductor substrate 1.

Figure 5:
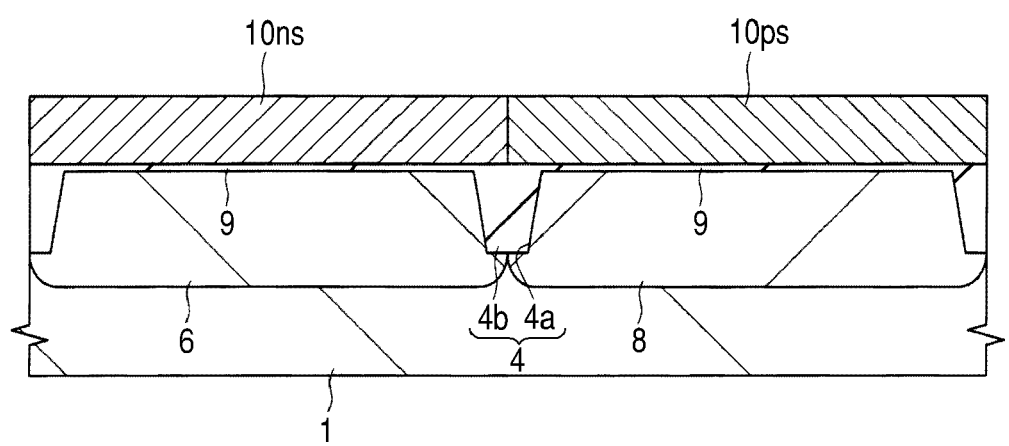
FIG. 5 is a section view of essential parts during the period of manufacture of the CMOS device following FIG. 4.

Next, as shown in FIG. 5, after the surface of the semiconductor substrate 1 is cleaned by wet etching using, for example, hydrofluoric (HF) aqueous solution, the semiconductor substrate 1 is thermally oxidized to form a gate insulating film 9 having a thickness of, for example, about 5 nm, over the surface (the respective surfaces of the p-type well 6 and the n-type well 8) of the semiconductor substrate 1. Subsequently, after an amorphous silicon film having a thickness of, for example, about 200 nm, is deposited over the gate insulating film 9 by the CVD method, n-type impurities, for example, phosphorus, are ion-implanted into the amorphous silicon film in the nMIS formation region and p-type impurities, for example, boron, are ion-implanted into the amorphous silicon film in the pMIS formation region.

Next, a thermal treatment is performed on the semiconductor substrate 1 at a temperature of, for example, 900° C., for about 10 seconds to activate the n-type impurities and the p-type impurities introduced in the amorphous silicon film, and to further change the amorphous silicon film in the nMIS formation region into an n-type polycrystalline silicon film 10ns and the amorphous silicon film in the pMIS formation region into a p-type polycrystalline silicon film 10ps.

Figure 6:
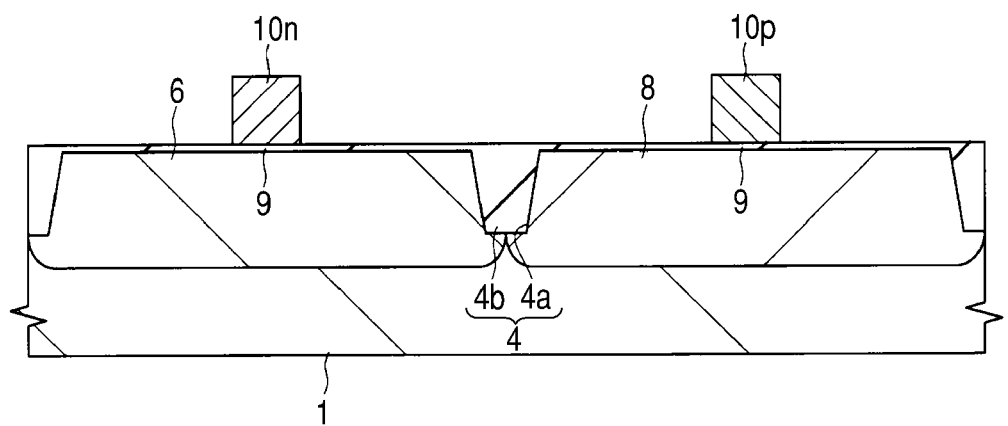
FIG. 6 is a section view of essential parts during the period of manufacture of the CMOS device following FIG. 5.

Next, as shown in FIG. 6, the n-type polycrystalline silicon film 10ns is processed by dry etching using a resist pattern as a mask, to form a gate electrode 10n *having a gate length of about* 50 nm made up of the n-type polycrystalline silicon film 10ns in the nMIS formation region. At the same time, the p-type polycrystalline silicon film 10ps is processed by dry etching using a resist pattern as a mask, to form a gate electrode 10p having a gate length of about 50 nm made up of the p-type polycrystalline silicon film 10ps in the pMIS formation region.

Figure 7:
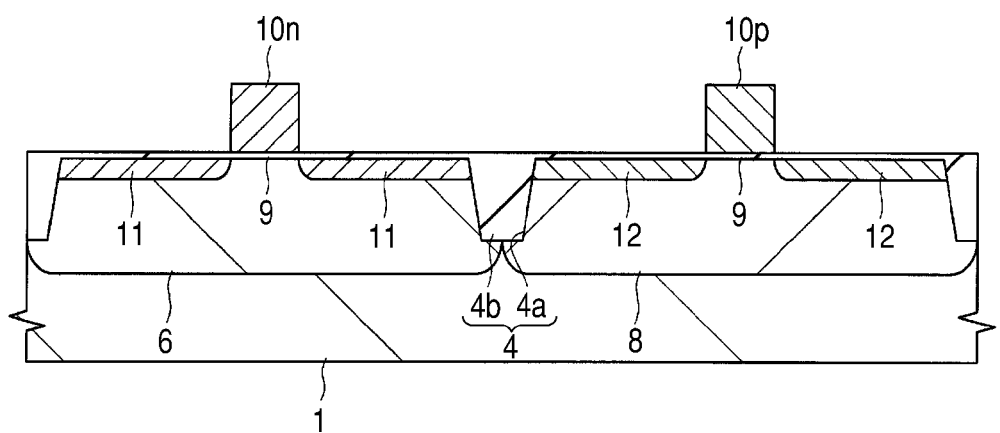
FIG. 7 is a section view of essential parts during the period of manufacture of the CMOS device following FIG. 6.

Next, as shown in FIG. 7, after the pMIS formation region is covered with a resist pattern, n-type impurities, for example, phosphorus or arsenic, are ion-implanted into the nMIS formation region of the semiconductor substrate 1 using the gate electrode 10n of nMIS as a mask to form a source/drain extension region 11 having a relatively low concentration of nMIS. Similarly, after the nMIS formation region is covered with a resist pattern, p-type impurities, for example, $BF_2$ (boron fluoride), are ion-implanted into the pMIS formation region of the semiconductor substrate 1 using the gate electrode 10p of pMIS as a mask to form a source/drain extension region 12 having a relatively low concentration of pMIS. The source/drain extension regions 11, 12 are, for example, about 30 nm deep.

Figure 8:
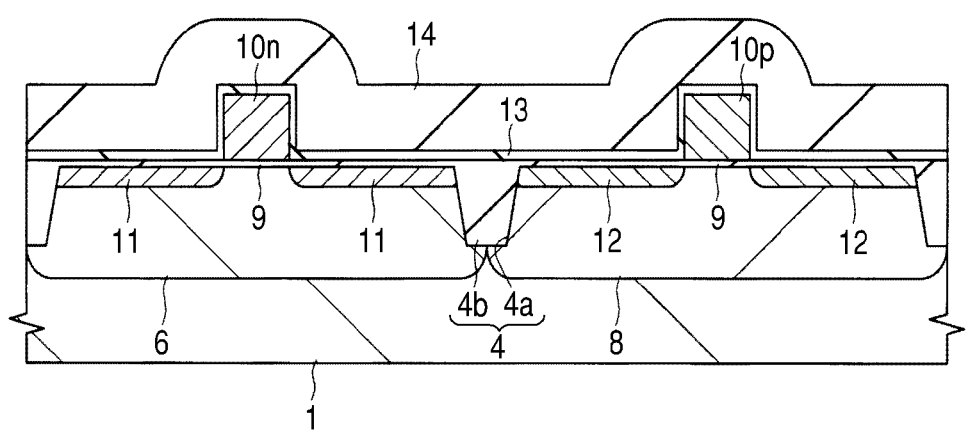
FIG. 8 is a section view of essential parts during the period of manufacture of the CMOS device following FIG. 7.

Next, as shown in FIG. 8, after a silicon oxide film 13 having a thickness of, for example, about 10 nm is deposited over the main surface of the semiconductor substrate 1, a silicon nitride film 14 is further deposited over the silicon oxide film 13 by the CVD method.

Figure 9:
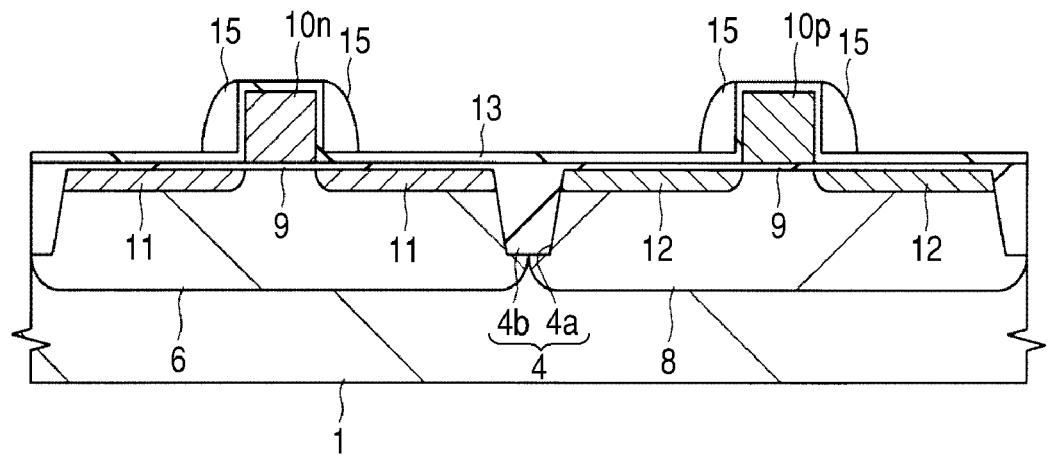
FIG. 9 is a section view of essential parts during the period of manufacture of the CMOS device following FIG. 8.

Next, as shown in FIG. 9, the silicon nitride film 14 is subjected to anisotropic etching by the RIE (Reactive Ion Etching) method, to form a sidewall 15 on the respective sidewalls of the gate electrode 10n of nMIS and the gate electrode 10p of pMIS.

Figure 10:
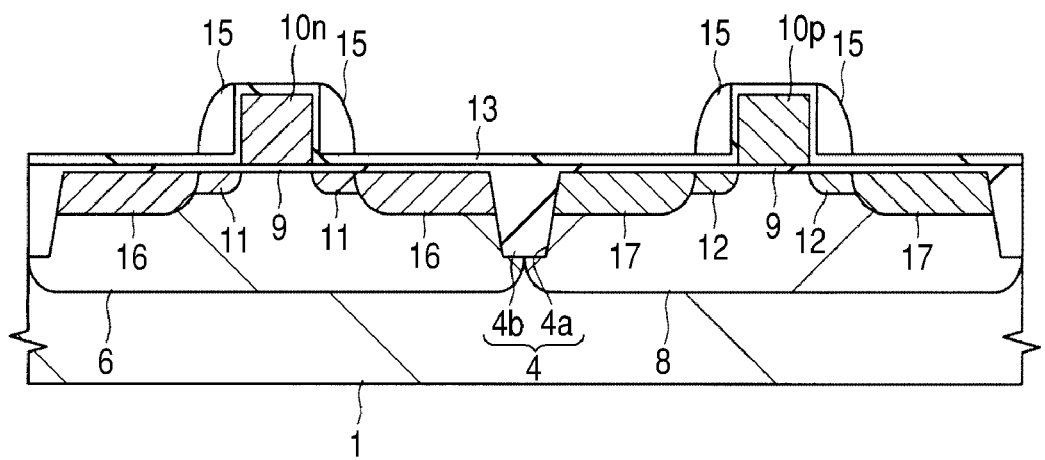
FIG. 10 is a section view of essential parts during the period of manufacture of the CMOS device following FIG. 9.
Figure 11:
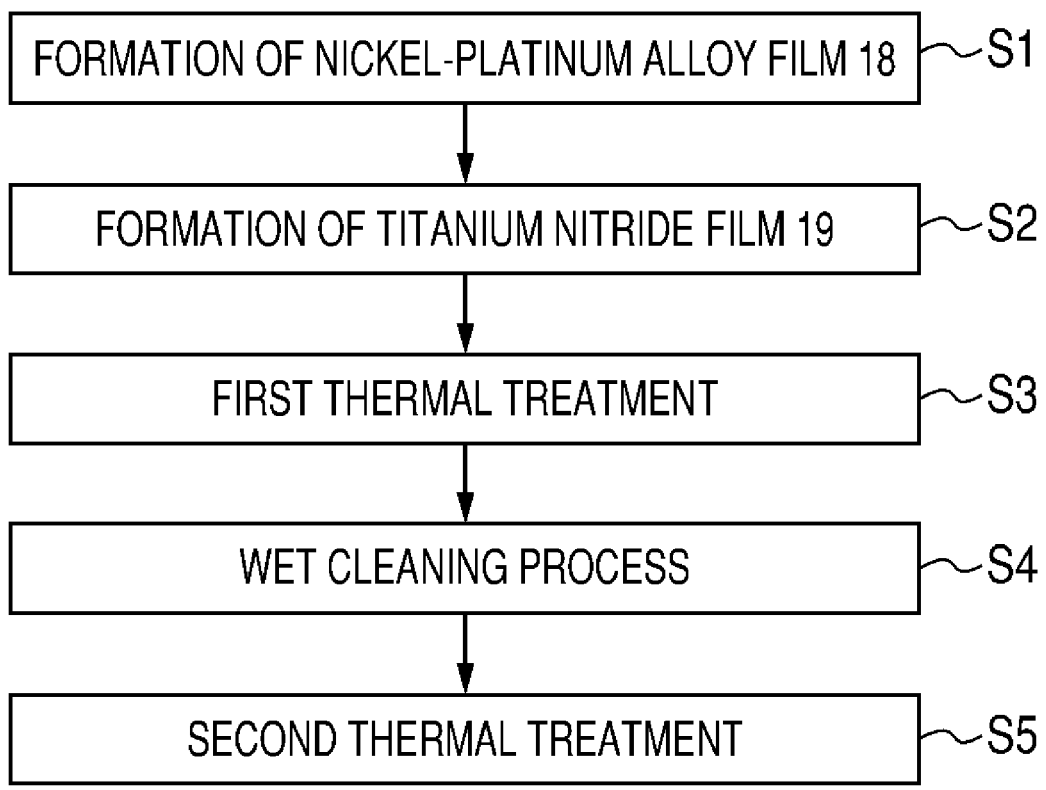
FIG. 11 is a manufacturing process flow diagram of a process to form a silicide layer using a SALICIDE technique according to the first embodiment of the present invention.

Next, as shown in FIG. 10, after the pMIS formation region is covered with a resist pattern, n-type impurities, for example, arsenic, are ion-implanted into the p-type well 6 using the gate electrode 10n of nMIS and the sidewall 15 as a mask to form a source/drain diffusion region 16 having a relatively high concentration of nMIS. Similarly, after the nMIS formation region is covered with a resist pattern, p-type impurities, for example, boron fluoride, are ion-implanted into the n-type well 8 using the gate electrode 10p of pMIS and the sidewall 15 as a mask to form a source/drain diffusion region 17 having a relatively high concentration of pMIS. The source/drain diffusion regions 16, 17 are, for example, about 50 nm deep. After the impurities are implanted, the semiconductor substrate 1 is subjected to the anneal process at a temperature of about 1,050° C. in order to activate the impurities and to repair the damage due to implantation of the semiconductor substrate 1.

Next, a platinum-added nickel silicide layer with a low resistance is formed over the surface of the gate electrode 10n of nMIS and the source/drain diffusion region 16 and on the surface of the gate electrode 10p of pMIS and the source/drain diffusion region 17 by the SALICIDE technique. A process for forming the platinum-added nickel silicide layer will be described below. A manufacturing process flow diagram of the process for forming a platinum-added nickel silicide layer is shown in FIG. 11.

Figure 12:
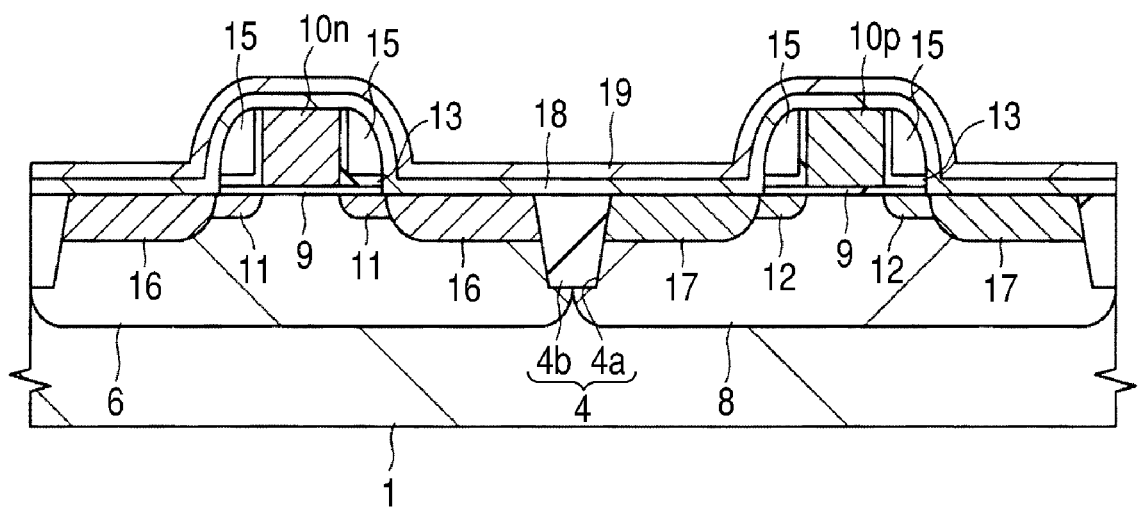
FIG. 12 is a section view of essential parts during the period of manufacture of the CMOS device following FIG. 10.

First, as shown in FIG. 12, a nickel-platinum alloy film (alloy film of nickel and platinum) 18 is deposited over the main surface of the semiconductor substrate 1 by the sputtering method (step S1 in FIG. 11) and a titanium nitride film 19 is further deposited sequentially thereover (step S2 in FIG. 11). The nickel-platinum alloy film 18 is, for example, about 10 nm thick and the titanium nitride film 19 is, for example, about 15 nm thick. The amount of platinum included in the nickel-platinum alloy film 18 is, for example, about 5%. The titanium nitride film 19 is provided over the nickel-platinum alloy film 18 in order to prevent the oxidation of the nickel-platinum alloy film 18 and a titanium film may be used instead of the titanium nitride film 19.

For the formation of the nickel-platinum alloy film 18 and the titanium nitride film 19, a device 20 for forming a film of a silicide material shown in FIG. 13 is used. An example of a preferred method of forming the nickel-platinum alloy film 18 and the titanium nitride film 19 will be described below.

As shown in FIG. 13, the film forming device 20 is of multi-chamber type, in which two transfer chambers, that is, a first transfer chamber 21a and a second transfer chamber 21b are arranged, and a loader 23, an unloader 24, and three chambers 25, 26, 27 are provided around the first transfer chamber 21a via a gate valve 22 that is an opening/closing means, and two chambers 28, 29 are provided around the second transfer chamber 21b via the gate valve 22 that is an opening/closing means. Further, between the first transfer chamber 21a and the second transfer chamber 21b, two transfer chambers 30, 31 are provided. The first transfer chamber 21a is kept at a predetermined degree of vacuum by an exhaust mechanism etc. and in the center thereof, a transfer robot 32a with an articulated arm structure is provided in order to transfer the semiconductor wafer (sometimes referred to simply as wafer) SW. Similarly, the second transfer chamber 21b is kept at a predetermined degree of vacuum by an exhaust mechanism etc. and in the center thereof, a transfer robot 32b with an articulated arm structure is provided in order to transfer the semiconductor wafer SW.

The chambers 25, 26 provided in the first transfer chamber 21a are thermal treatment chambers that carry out a relatively high-temperature thermal treatment and the chamber 27 is a dry cleaning processing chamber. The chamber 28 provided in the second transfer chamber 21b is a nickel-platinum alloy film forming chamber for forming the nickel-platinum alloy film 18 by the sputtering method and the chamber 29 is a titanium nitride film forming chamber for forming the titanium nitride film 19 by the sputtering method. The chambers 30, 31 provided between the first transfer chamber 21a and the second transfer chamber 21b are delivery chambers for delivering the semiconductor wafer SW between the first transfer chamber 21a and the second transfer chamber 21b and at the same time, are cooling chambers also used to cool down the semiconductor wafer SW. In the film forming device 20, the number of chambers provided only in the first transfer chamber 21a is three and the number of chambers provided only in the second transfer chamber 21b is two, however, this is not limited and it is possible to add a chamber for the same purpose or a chamber for another purpose.

After a FOUP (Front Open Unified Pod) mounting a plurality of the semiconductor wafers SW is placed on the loader 23 (process P1 in FIG. 14), one semiconductor wafer SW is taken out from the FOUP using the transfer robot 32a and is transferred under vacuum into the first transfer chamber 21a. The FOUP is a hermetically sealed storage container for batch transfer of the semiconductor wafer SW and usually stores the semiconductor wafer SW in units of batches of 25, 12, 6, etc. The outer wall of the FOUP container has a hermetically sealed structure except for a fine ventilation filter part and dust is removed almost perfectly. Consequently, even if transfer is conducted in an atmosphere of class 1,000, a degree of cleanness of class 1 can be kept inside thereof. Docking with the film forming device 20 is conducted in a state in which the cleanness is kept by pulling in the door of the FOUP to the inside of the film forming device 20.

Next, the semiconductor wafer SW is transferred under vacuum from the first transfer chamber 21a to the dry cleaning processing chamber 27 by means of the transfer robot 32a (process P2 in FIG. 14). FIG. 15 shows a schematic section view of the chamber 27. The chamber 27 mainly includes a wafer stage 27a, a wafer lift pin 27b, a shower head 27c, and a remote plasma generation device 27d. The wafer stage 27a and the wafer lift pin 27b have an independent lift mechanism and can control arbitrarily the distance between the shower head 27c and the semiconductor wafer SW and the distance between the semiconductor wafer SW and the wafer stage 27a. The shower head 27c installed above the wafer stage 27a is always kept at a constant temperature and the temperature is, for example, 180° C.

When the semiconductor wafer SW is transferred into the chamber 27, the wafer stage 27a is lowered, the wafer lift pin 27b is lifted, and the semiconductor wafer SW is placed on the wafer lift pin 27b as shown in FIG. 16(a). The distance between the shower head 27c and the semiconductor wafer SW is set to, for example, 16.5±12.7 mm and the distance between the semiconductor wafer SW and the wafer stage 27a to, for example, 25.4±17.8 mm.

Subsequently, when the main surface of the semiconductor wafer SW is subjected to the dry cleaning process, the wafer stage 27a is lifted, the wafer lift pin 27b is lowered, and the semiconductor wafer SW is placed on the wafer stage 27a as shown in FIG. 16(b). The distance between the shower head 27c and the semiconductor wafer SW is set to, for example, 17.8±5.1 mm.

At the time of the dry cleaning process, a reducing gas, for example, an Ar gas added with a $NF_3$ gas and a $NH_3$ gas is excited to generate plasma in the remote plasma generation device 27d and the plasma is introduced into the chamber 27. By supplying the plasma introduced into the chamber 27 over the main surface of the semiconductor wafer SW via the shower head 27c, a natural oxide film is removed by a reducing reaction, such as one shown by chemical formula (1), which takes place between the plasma and the natural oxide film formed over the surface of silicon (the single crystal silicon constituting the semiconductor substrate 1 over which the n-type polycrystalline silicon film 10ns constituting the gate electrode 10n of nMIS and the source/drain diffusion region 16 are formed and the single crystal silicon constituting the semiconductor substrate 1 over which the p-type polycrystalline silicon film 10ps constituting the gate electrode 10p of pMIS and the source/drain diffusion region 17 are formed). The process conditions at the time of the dry cleaning process are that, for example, the temperature of the shower head is 180° C., the $NF_3$ gas flow rate is 14 sccm, the $NH_3$ gas flow rate is 70 sccm, the pressure is 400 Pa, and the plasma power is 30 W.

$$SiO_2 + NF_3 + NH_3 \rightarrow (NH_4)_2SiF_6 + O_2 \qquad \text{Chemical formula (1)}$$

At this time, the product $((NH_4)_2SiF_6)$ generated in the reducing reaction remains over the main surface of the semiconductor wafer SW. Further, the semiconductor wafer SW is only placed over the wafer stage 27a, and therefore, the product also remains on part of the side and rear surface of the semiconductor wafer SW. The product that remains on part of the side and rear surface of the semiconductor wafer SW peels off when the semiconductor wafer SW is transferred to another chamber etc., causing contamination and occurrence of dust. Consequently, following the dry cleaning process, the semiconductor wafer SW is subjected to a thermal treatment in the chamber 27, thereby the product that remains on part of the side and rear surface of the semiconductor wafer SW is removed, and at the same time the product that remains over the main surface of the semiconductor wafer SW is removed.

Subsequently, when the semiconductor wafer SW is subjected to the thermal treatment, as shown in FIG. 16(c), the wafer stage 27a is lowered, the wafer lift pin 27b is lifted, and the semiconductor wafer SW is put near the shower head 27c set to a temperature of 180° C. The distance between the shower head 27c and the semiconductor wafer SW is set to, for example, 3.8±2.6 mm and the distance between the semiconductor wafer SW and the wafer stage 27a is set to, for example, 5.9 mm or more.

At the time of the thermal treatment, the semiconductor wafer SW is heated using the heating temperature (180° C.) of the shower head 27c. The temperature of the semiconductor wafer SW becomes 100 to 150° C. and the product ($(NH_4)_2SiF_6$) formed over the main surface of the semiconductor wafer SW at the time of the dry cleaning process is sublimated and removed by a reaction, such as one shown by chemical formula (2). Further, by this thermal treatment, the side and rear surface of the semiconductor wafer SW are also heated and the product that remains on part of the side and rear surface is also removed.

$$(NH_4)_2SiF_6 \rightarrow SiF_4 + 2NH_3 + 2HF \quad \text{Chemical formula (2)}$$

However, if the composition of the product formed over the semiconductor wafer SW during the period of dry cleaning process deviates, if slightly, from $(NH_4)_2SiF_6$, the reaction shown by chemical formula (2) is difficult to take place by the thermal treatment at a temperature of 100 to 150° C. and it is no longer possible to remove the product completely and a trace of the product will remain over the main surface of the semiconductor wafer SW. As described above, if a trace of the product remains over the main surface of the semiconductor wafer SW, the electric resistances vary in the nickel silicide layer formed over the main surface of the semiconductor wafer SW afterward. Consequently, in the next process, the semiconductor wafer SW is subjected to a thermal treatment at a temperature higher than 150° C. to remove the trace of the product that remains over the surface of the semiconductor wafer SW.

Next, the semiconductor wafer SW is transferred under vacuum from the dry cleaning processing chamber 27 to the heating processing chamber 25 (or the chamber 26) via the first transfer chamber 21a by means of the transfer robot 32a and is placed on the stage provided in the chamber 25 (or chamber 26) (process P3 in FIG. 14). After the semiconductor wafer SW is placed on the stage in the chamber 25 (or chamber 26), the semiconductor wafer SW is heated at a predetermined temperature to sublimate and remove the product that has not been sublimated at a temperature of 100 to 150° C. and remains over the main surface of the semiconductor wafer SW. The temperature of the main surface of the semiconductor wafer SW is thought to be appropriate when it is in a range of 150 to 400° C. (however, it is obvious that the temperature is not limited to this range under other conditions). A range suitable for mass-production is thought to be a range of 165 to 350° C. and further, a range of 180 to 220° C. with 200° C. as its center is thought to be most suitable.

Next, the semiconductor wafer SW is transferred under vacuum from the heating processing chamber 25 (or the chamber 26) to the cooling/delivery chamber 30 (or the chamber 31) via the first transfer chamber 21a by means of the transfer robot 32a and is placed on the stage provided in the chamber 30 (or the chamber 31) (process P4 in FIG. 14). Placing the semiconductor wafer SW on the stage in the chamber 30 (or the chamber 31) cools down the semiconductor wafer SW.

Next, the semiconductor wafer SW is transferred under vacuum from the cooling/delivery chamber 30 (or the chamber 31) to the nickel-platinum alloy film forming chamber 28 via the second transfer chamber 21b by means of the transfer robot 32b (process P5 in FIG. 14). After a predetermined degree of vacuum, for example, about $1.33 \times 10^{-6}$ Pa is established in the chamber 28 by means of an exhaust mechanism, the semiconductor wafer SW is heated to a predetermined temperature, and the nickel-platinum alloy film 18 is deposited over the main surface of the semiconductor wafer SW by introducing the Ar gas into the chamber 28 at a predetermined flow rate and using the sputtering method. The process of deposition of the nickel-platinum alloy film 18 corresponds to step S1 (step S1 in FIG. 11). The nickel-platinum alloy film 18 is, for example, 8 to 14 nm thick and the sputtering conditions at the time of film formation are that, for example, the temperature of film formation is 40° C. and the flow rate of Ar gas is 13 sccm.

Next, the semiconductor wafer SW is transferred under vacuum from the nickel-platinum alloy film forming chamber 28 to the titanium nitride film forming chamber 29 via the second transfer chamber 21b by means of the transfer robot 32b (process P6 in FIG. 14). After establishing a predetermined degree of vacuum in the chamber 29 by means of an exhaust mechanism, the semiconductor wafer SW is heated to a predetermined temperature and the titanium nitride film 19 is deposited on the main surface of the semiconductor wafer SW by introducing the Ar gas and the $N_2$ gas into the chamber 29 at a predetermined flow rate and using the sputtering method. The process of deposition of the titanium nitride film 19 corresponds to step S2 (step S2 in FIG. 11) described above. The titanium nitride film 19 is, for example, 15 nm thick and the sputtering conditions at the time of film formation are that, for example, the temperature of film formation is 40° C., the flow rate of Ar gas is 28 sccm, and the flow rate of nitrogen gas is 80 sccm.

Next, the semiconductor wafer SW is transferred under vacuum from the titanium nitride film forming chamber 29 to the cooling/delivery chamber 30 (or the chamber 31) via the second transfer chamber 21b by means of the transfer robot 32b (process P7 in FIG. 14).

Next, the semiconductor wafer SW is transferred under vacuum from the cooling/delivery chamber 30 (or the chamber 31) to the unloader 24 by means of the transfer robot 32a and then is placed on the FOUP put in the unloader 24 (process P8 in FIG. 14).

In the dry cleaning process in the first embodiment, plasma is generated by exciting a reducing gas, for example, the Ar gas added with the $NF_3$ gas and $NH_3$ gas (as a gas for plasma excitation, the Ar gas is used frequently, however, other noble gases or a mixed gas thereof may be used) in the remote plasma generation device 27d and the plasma is introduced into the chamber 27 and the natural oxide film is removed by the reducing reaction, however, it may also be possible to remove the natural oxide film by the reducing reaction by introducing a reducing gas, such as a mixed gas of the HF gas and the $NH_3$ gas or a mixed gas of the $NF_3$ gas and the $NH_3$ gas, into the chamber 27 without using plasma.

In addition, the device is not limited to the remote plasma device and it will not bring about any problem to use a normal plasma device provided other characteristics are not problematic. Remote plasma has an advantage that it does not damage a substrate.

In the process using plasma, not limited to the above-mentioned combinations of gases, other combinations of gases may be used provided the radicals or reactive seeds of nitrogen, hydrogen, and fluorine (including the compound radicals thereof) are generated and not detrimental to this process in particular. That is, an atmosphere of a mixed gas of the radical generation gas of nitrogen, hydrogen, and fluorine (including their mixed gas), a plasma-excited gas, and other additive gases may be used appropriately.

The reactive gas, such as the reducing gas, is not limited to the above-mentioned gases, but any gas may be used provided it generates a reactive seed that reacts with an oxide film over the silicon surface and evaporates at a comparatively low temperature.

Figure 17:
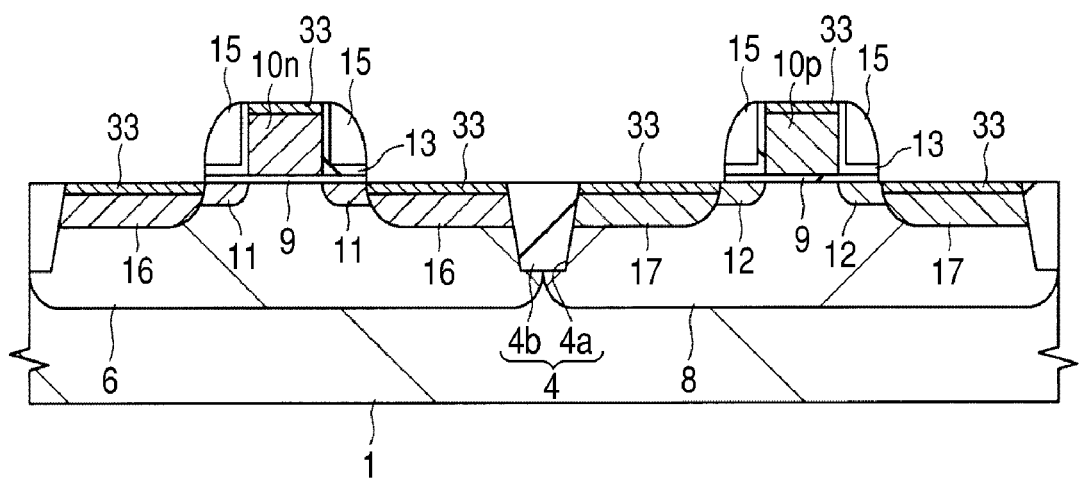
FIG. 17 is a section view of essential parts during the period of manufacture of the CMOS device following FIG. 12.

After that, the semiconductor substrate 1 is subjected to the thermal treatment, to form a platinum-added nickel silicide layer 33 in a PtNiSi phase over the surface of the gate electrode 10n of nMIS and the source/drain diffusion region 16 and over the surface of the gate electrode 10p of pMIS and the source/drain diffusion region 17, as shown in FIG. 17. The thermal treatment method for forming the platinum-added nickel silicide layer 33 will be described below by three divided processes (silicide reaction process, unreacted film removal process, and silicide stabilization process). The conditions of formation of the platinum-added nickel silicide layer 33 in the first embodiment are summarized in Table 1.

TABLE 1

| Metal film | NiPt(8-14 nm) | |
| --- | --- | --- |
| Barrier film | Tin(15 nm) | |
| 1st RTA | 210-310° C. | 30-250° C./s |
| 2nd RTA | Soak: 380-495° C. | 10-250° C./s |
| | Spike: 380-525° C. | 10-250° C./s |

(Silicide Reaction Process)

First, the semiconductor substrate 1 over which the nickel-platinum alloy film 18 and the titanium nitride film 19 are deposited sequentially is subjected to a first thermal treatment (1st anneal process) using the RTA (Rapid Thermal Anneal) method (step 3 in FIG. 11). Whereby, the n-type polycrystalline silicon film 10ns constituting the nickel-platinum alloy film 18 and the gate electrode 10n of nMIS and the single crystal silicon constituting the semiconductor substrate 1 over which the nickel-platinum alloy film 18 and the source/drain diffusion region 16 of nMIS are formed are selectively caused to react with each other to form the platinum-added nickel silicide layer 33 in a $(PtNi)_2Si$ (dimetal silicide) phase. Similarly, the p-type polycrystalline silicon film lops constituting the nickel-platinum alloy film 18 and the gate electrode 10p of pMIS and the single crystal silicon constituting the semiconductor substrate 1 on which the nickel-platinum alloy film 18 and the source/drain diffusion region 17 of pMIS are formed are selectively caused to react with each other to form the platinum-added nickel silicide layer 33 in the $(PtNi)_2Si$ phase.

The temperature of the first thermal treatment in step S3 is thought to be appropriate if it is in a range of, for example, 210 to 310° C. (however, it is obvious that the temperature is not limited to this range under other conditions). In addition, a range most suitable for mass-production is thought to be a range of temperatures with 270° C. as its central temperature. Consequently, a heater heating device is used in the silicide reaction of the nickel-platinum alloy film. By using a heater heating device, it is made possible to control the temperature in the range of 210 to 310° C., which is the temperature of the first thermal treatment and therefore the platinum-added nickel silicide layer 33 in the $(PtNi)_2Si$ phase can be formed in the plane of a wafer.

Figure 30A:
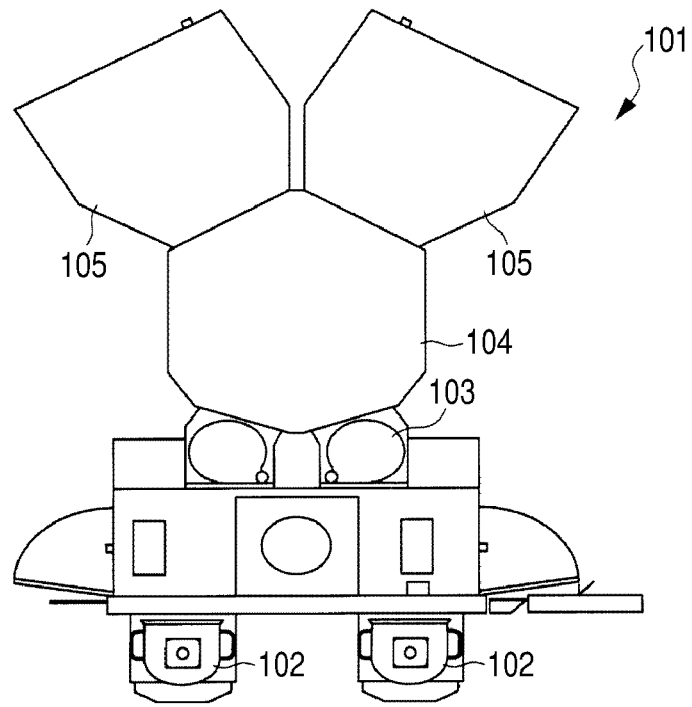
FIGS. 30(a), 30(b), and 30(c) are a plan view of a general configuration of a lamp heating device the present inventors have studied, a section view of essential parts in a chamber, and a plan view of essential parts of a susceptor part, respectively.
Figure 30B:
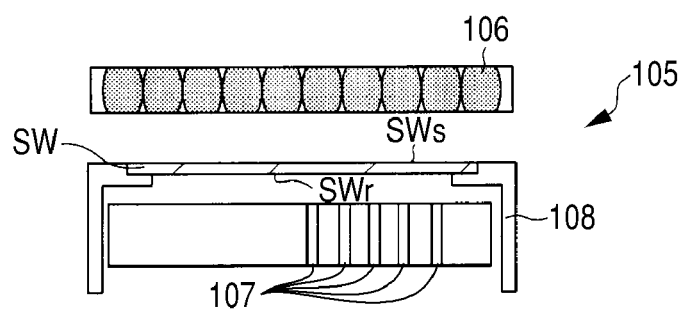
Figure 30C:
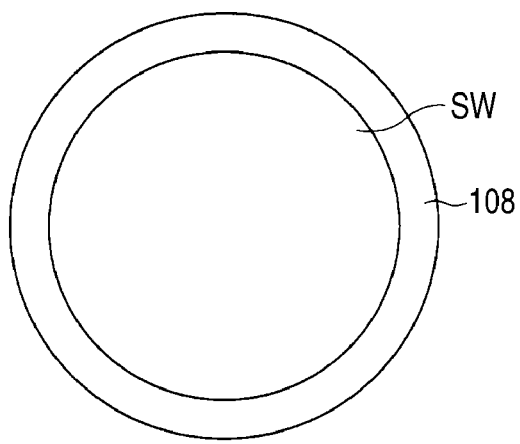

The temperature rise rate in the heater heating device is set to 10° C./s or more, for example, 30 to 250° C./s. By raising the temperature rapidly at a temperature rise rate of 30 to 250° C./s of the first thermal treatment (when the lamp heating device 101 shown in FIG. 30 described above is used, the temperature rise rate of the first thermal treatment is 3 to 5° C./s), the application of an excessive amount of heat can be suppressed in the temperature rise process in the silicide reaction and it is possible to form the platinum-added nickel silicide layer 33 only with the $(PtNi)_2Si$ phase, not including the $(PtNi)Si_2$ phase, the PtNiSi phase, the $(PtNi)_3Si$ phase, the $(PtNi)_5Si$ phase etc.

Further, in order to improve the thermal conductivity of the atmosphere in the first thermal treatment, it is preferable to carry out the thermal treatment under the normal pressure, filled with an inert gas the thermal conductivity of which is higher than that of nitrogen, for example, a helium (He) gas or neon (Ne) gas, or an ambient gas including a nitrogen gas added with an inert gas the thermal conductivity of which is higher than that of the nitrogen gas. For example, the thermal conductivities of the nitrogen gas, the neon gas, and the helium gas at 100° C. are $3.09 \times 10^{-2}$ $Wm^{-1}K^{-1}$, $5.66 \times 10^{-2}$ $Wm^{-1}K^{-1}$, and $17.77 \times 10^{-2}$ $Wm^{-1}K^{-1}$, respectively.

As described above, by carrying out the first thermal treatment with a temperature rise rate of 30 to 250° C./s in a thermal treatment atmosphere in which the thermal conductivity is comparatively high using a heater heating device that can control the temperature of the silicide reaction in a range of 210 to 310° C., the silicide reaction takes place uniformly in the wafer plane, and therefore, it is possible to suppress the application of an excessive amount of heat in the temperature rise process of the silicide reaction. Consequently, in the silicide reaction by the first thermal treatment according to the first embodiment, it is possible to uniformly form the platinum-added nickel silicide layer 33 including only the $(PtNi)_2Si$ phase in the wafer plane and to suppress the formation of the platinum-added nickel silicide layer in the mixed phase state where, for example, the $(PtNi)Si_2$ phase, the PtNiSi phase, the $(PtNi)_2Si$ phase, the $(PtNi)_3Si$ phase, the $(PtNi)_5Si$ phase and the like are included mixedly.

FIG. 18 shows a graph diagram for illustrating the temperature rise characteristic of a heater heating device and a lamp heating device. As shown in FIG. 18, a time (t1) required for the temperature to reach a predetermined temperature (T1) in the heater heating device is shorter than a time (t2) required for the temperature to reach the predetermined temperature (T1) in the lamp heating device. In particular, it is possible, in the process using the heater heating device, to shorten the time required for the temperature to reach a temperature of about 280° C. at which reading of the wafer temperature is started in the process using the lamp heating device and the control of the wafer temperature becomes possible. In the lamp heating device, it is possible to shorten the time required for the temperature to reach the predetermined temperature (T1) less than the above-mentioned time t2 by increasing the lamp power to shorten the time required for the temperature to reach a temperature of about 280° C. However, if the lamp power is increased, variations in temperature in the wafer plane are caused, and in particular, the difference in temperature between the periphery of the wafer and its center becomes large and there is a possibility that the wafer deforms. Consequently, it is not possible to increase the temperature rise rate of the lamp heating device to that of the heater heating device.

FIG. 19 shows a graph diagram for illustrating the relationship between the sheet resistance of the platinum-added nickel silicide layer and the temperature of the first thermal treatment. The vertical axis in the graph diagram denotes the sheet resistance of the platinum-added nickel silicide layer formed by depositing the nickel-platinum alloy film over the silicon substrate (N-sub) to which n-type impurities (for example, phosphorus or arsenic) have been introduced, and over the silicon substrate (P-sub) to which p-type impurities (for example, boron) have been introduced, respectively, and then subjecting the thermal treatment to each of the substrates, and the horizontal axis denotes the temperature of the first thermal treatment.

As shown in FIG. 19, in the platinum-added nickel silicide layer formed over the P-sub, the $(PtNi)_2Si$ phase is formed in a temperature range of 280 to 310° C., however, in the platinum-added nickel silicide layer formed over the N-sub, the $(PtNi)_2Si$ phase is formed at a temperature of about 280° C. At temperatures significantly apart from this temperature range, the platinum-added nickel silicide layer in a mixed phase state where the phases, such as the $(PtNi)Si_2$ phase, the PtNiSi phase, the $(PtNi)_2Si$ phase, the $(PtNi)_3Si$ phase, and the $(PtNi)_5Si$ phase, exist mixedly is likely to be formed. From this result, a suitable range of the temperature of the first thermal treatment can be thought to be, for example, 210 to 310° C. although this varies depending on other conditions, such as a structure of each portion constituting the heater heating device.

Figures 20A, 20B:
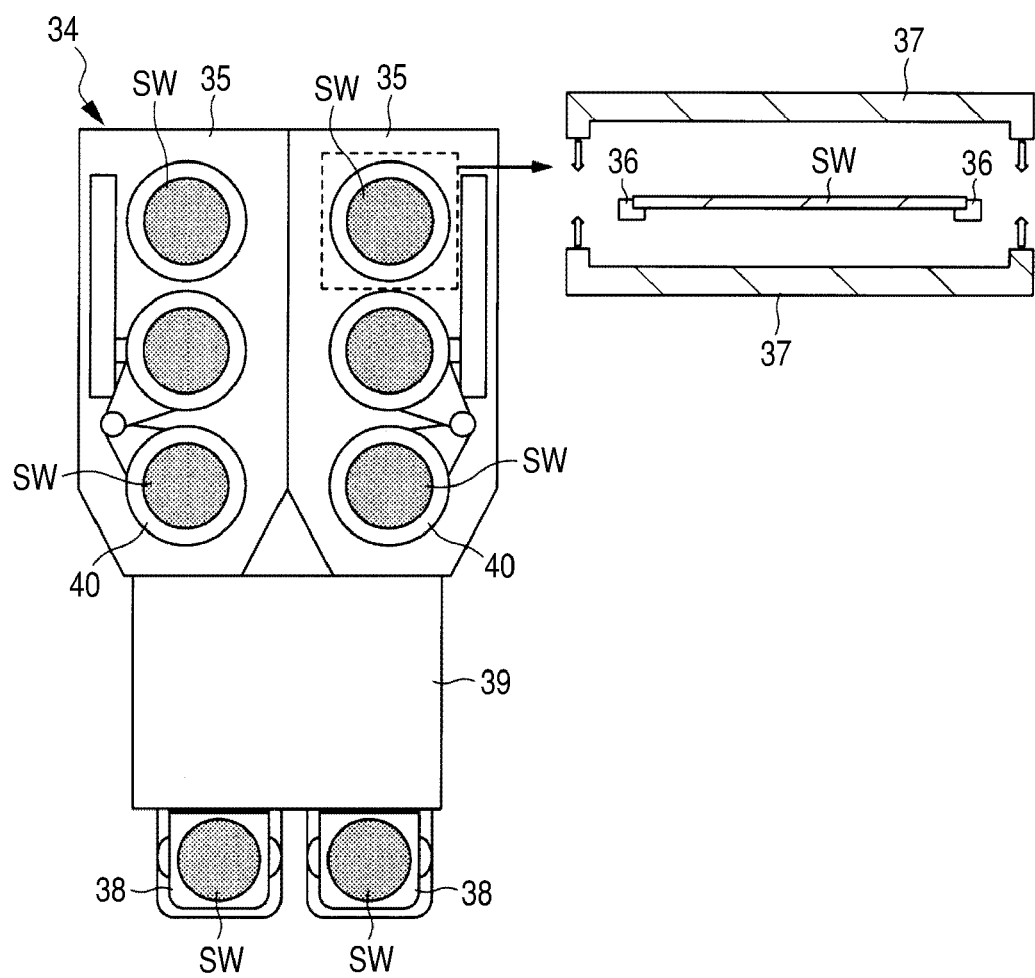
FIGS. 20(a) and 20(b) are a plan view of a general configuration of the heater heating device and a section view of essential parts in a chamber, respectively, according to the first embodiment of the present invention.

FIGS. 20(a) and 20(b) show a plan view of the entire configuration of the heater heating device used in the first thermal treatment and a section view of essential parts within the chamber, respectively.

When the first thermal treatment is carried out, the wafer SW is placed on a susceptor 36 within a processing chamber 35 of a heater heating device 34. The chamber 35 is always filled with an inert gas (for example, a nitrogen gas atmosphere added with a neon gas). Resistance heaters 37 are installed above and below the wafer SW (front surface and rear surface) and the wafer SW is heated by thermal conduction from the resistance heaters 37 sandwiching the wafer SW a predetermined distance apart therefrom. The distance between the wafer SW and the resistance heater 37 is, for example, 1 mm or less. The temperature of the resistance heater 37 is measured using a thermocouple and the resistance heater 37 is controlled to be at a predetermined temperature. A hole for introducing a gas is formed in the resistance heater 37 and the ambient gas of the first thermal treatment is supplied to above and below the wafer SW (the front surface and the rear surface) through the hole. The flow of the ambient gas of the first thermal treatment and the pressure in the chamber 35 are adjusted, respectively, and the wafer SW is floated by equalizing the pressures applied on the front surface and the rear surface of the wafer SW and further, by making constant the amount of heat transmitted to the wafer SW, the variations in the temperature in the plane of the wafer SW are suppressed.

Figure 21A:
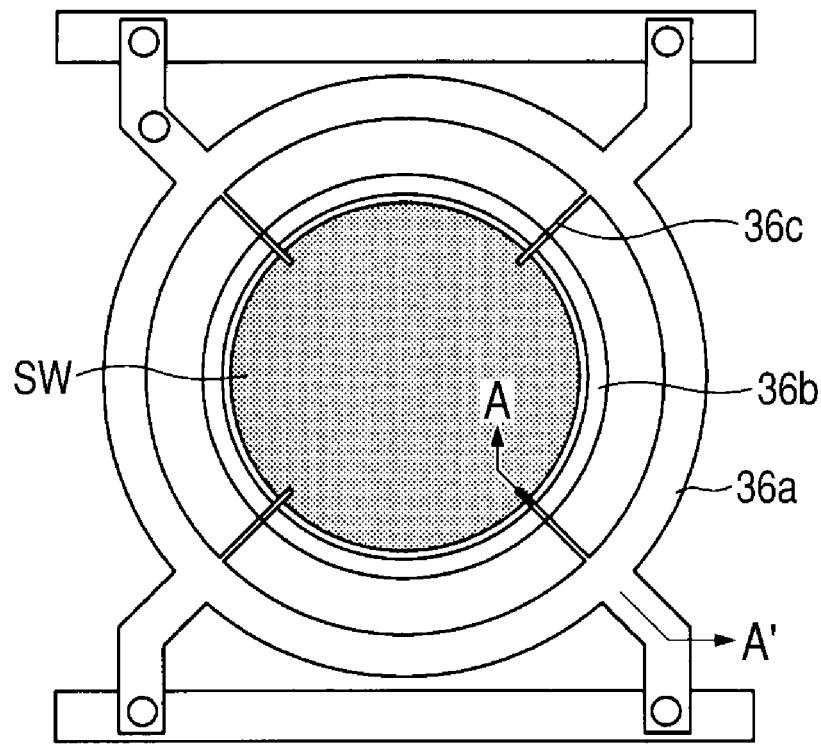
FIGS. 21(a) and 21(b) are a plan view of essential parts of a susceptor included in the heater heating device and a section view of essential parts thereof, respectively, according to the first embodiment of the present invention.
Figure 21B:
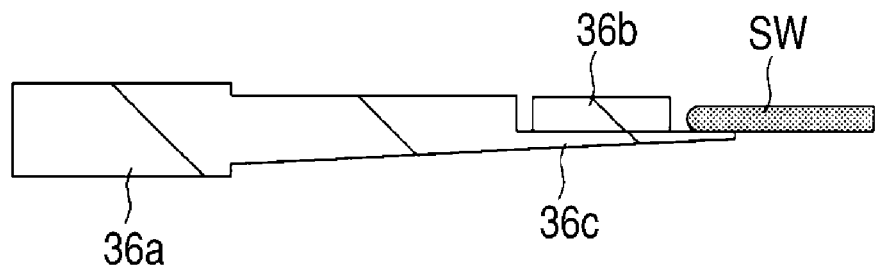
Figure 22:
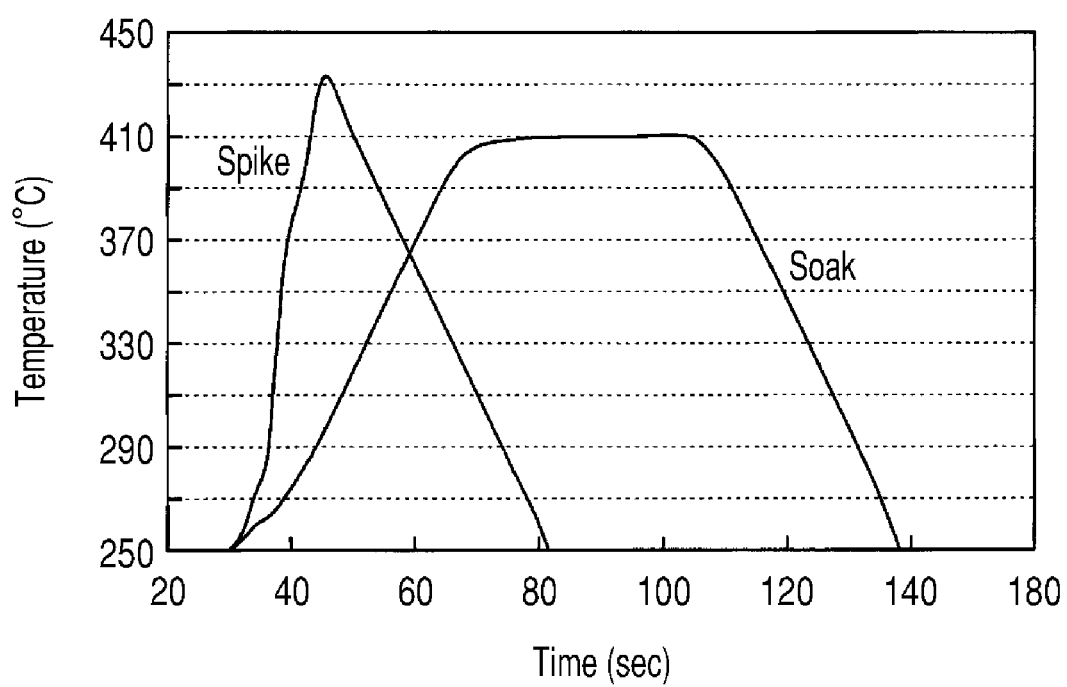
FIG. 22 is a graph diagram for illustrating the temperature characteristic of a soak anneal process and a spike anneal process according to the first embodiment of the present invention.

FIGS. 21(a) and 21(b) respectively show a plan view and a section view of essential parts of a susceptor provided in the heater heating device. In FIGS. 21(a) and 21(b), symbol 36a denotes a carrier plate, symbol 36b denotes a guard ring, and symbol 36c denotes a support pin. The susceptor 36 is in contact with the wafer SW only at four points using the four support pins 36c provided to the susceptor 36 and the number of contacts between the susceptor 36 and the wafer SW is small, and therefore, it is possible to suppress the temperature in the wafer plane from decreasing due to the presence of the susceptor 36.

The procedure of the first thermal treatment using the above-mentioned heater heating device 34 (refer to FIG. 20 and FIG. 21) will be described below. First, after a FOUP 38 is docked with the heater heating device 34, the wafer SW is transferred from the FOUP 38 onto a load lock 40 in the processing chamber 35 via a wafer delivery chamber 39. In order to prevent the processing chamber 35 from getting mixed with outside air (mainly oxygen), the outside air is discharged by causing an inert gas (for example, nitrogen gas) to flow in the atmospheric state in the load lock 40. Subsequently, the wafer SW is transferred from the load lock 40 and placed on the susceptor 36. Subsequently, the wafer SW is sandwiched by the resistance heaters 37 and heated. After that, the cooled-down wafer SW is returned to the load lock 40 and returned to the FOUP 38 via the wafer delivery chamber 39.

In Table 2, an example of a process step diagram of the first thermal treatment is shown. The wafer SW, after placed onto the susceptor 36, is sandwiched by the resistance heaters 37 kept at a thermal treatment temperature from above and below the wafer SW (front surface and rear surface). The wafer SW is held in this state, and thereby heated by the thermal conduction of the resistance heaters 37 for the total time of the time required for the temperature to rise and the processing time (Step No. 2 in Table 2). In this heater heating device 34, the wafer SW is heated by the thermal conduction with a gas between the wafer SW and the resistance heater 37 as a medium and a process gas is always supplied via the resistance heaters 37, and therefore, it is possible to raise the temperature of the wafer SW up to the same temperature as that of the resistance heater 37 at a temperature rise rate of 30 to 250° C./s and thus the application of an excessive amount of heat to the wafer SW can be suppressed.

TABLE 2

| | Step No. | | | |
| --- | --- | --- | --- | --- |
| | 1 | 2 | 3 | 4 |
| Step Name | Purge | Anneal | Open | Cooling |
| Time | 10 | 35 | 30 | 30 |
| $N_2$ | 20 | 20 | 20 | 20 |
| He | (20) | (20) | (20) | (20) |
| Temp. | 550 | 550 | 550 | 550 |
| Heater | Open | Close | Open | Open |

(Unreacted Film Removal Process)

Next, a wet cleaning process is carried out, and thereby the unreacted nickel-platinum alloy film 18 (that is, the nickel-platinum alloy film 18 that has not reacted with the gate electrode 10n of nMIS and the source/drain diffusion region 16, and the gate electrode 10p of pMIS and the source/drain diffusion region 17) and the titanium nitride film 19 are removed (step S4 in FIG. 11). At this time, the platinum-added nickel silicide layer 33 in the $(PtNi)_2Si$ phase is left to remain over the surface of the gate electrode 10n of nMIS and the source/drain diffusion region 16 and over the surface of the gate electrode 10p of pMIS and the source/drain diffusion region 17. The wet cleaning process in step S4 can be carried out by the wet cleaning using sulfuric acid, the wet cleaning using sulfuric acid and hydrogen peroxide solution, etc.

(Silicide Stabilization Process)

Next, the semiconductor substrate 1 is subjected to the second thermal treatment (2nd anneal process) using the RTA method, and thereby the platinum-added nickel silicide layer 33 is reduced in resistance and stabilized (step S5 in FIG. 11). The thermal treatment temperature of the second thermal treatment in step S5 is set to a thermal treatment temperature higher than that of the first thermal treatment in step S3. Consequently, it is possible to turn the platinum-added nickel silicide layer 33 in the $(PtNi)_2Si$ phase formed by the first thermal treatment in step 3 into the platinum-added nickel silicide layer 33 in the PtNiSi (metal mono silicide) phase. In addition, the second thermal treatment is carried out in step S5, to make the composition of the platinum-added nickel silicide layer 33 further uniform; to make the composition ratio between the metal elements Ni and Si in the platinum-added nickel silicide layer 33 closer to 1:1, that is, the stoichiometric ratio; and therefore to enable stabilization of the platinum-added nickel silicide layer 33. The resistivity of the PtNiSi phase is lower than that of the $(PtNi)_2Si$ phase and that of the $(PtNi)Si_2$ phase and in step S5 and subsequent steps, the platinum-added nickel silicide layer 33 is maintained in the PtNiSi phase with a low resistance until the manufacture of the semiconductor device is completed and in the manufactured semiconductor device, the platinum-added nickel silicide layer 33 continues to have the PtNiSi phase with a low resistance even in a state where, for example, the semiconductor substrate 1 is segmented into individual semiconductor chips.

However, the present inventors have considered and found that if the thermal treatment temperature of the second thermal treatment in step S5 is too high, $(PtNi)Si_2$ is likely to grow abnormally from the platinum-added nickel silicide layer 33 to the channel part because the metal element PtNi constituting the platinum-added nickel silicide layer 33 diffuses excessively due to the second thermal treatment in step S5. It has also been found that an unwanted $(PtNi)Si_2$ part is formed and there is a possibility that the electric resistance of the platinum-added nickel silicide layer 33 varies for each pMIS and nMIS.

Therefore, in the first embodiment, the thermal treatment temperature of the second thermal treatment in step S5 is set to be lower than the temperature at which the lattice size (lattice constant) of $(PtNi)Si_2$ coincides with that of silicon constituting the semiconductor substrate 1. Consequently, when the second thermal treatment in step S5 is carried out, it is possible to suppress or prevent $(PtNi)Si_2$ from growing abnormally from the platinum-added nickel silicide layer 33 to the channel part and to reduce the variations in the electric resistance of each platinum-added nickel silicide layer 33 by suppressing or preventing the formation of the unwanted $(PtNi)Si_2$ part. This is disclosed in Japanese Patent Application No. 2007-17554 by Okada et al. (filed on Jul. 3, 2007) and therefore its explanation is omitted here.

In the second thermal treatment in step S5, in order to prevent the application of an excessive amount of heat to the platinum-added nickel silicide layer 33, the temperature rise rate is set to 10° C./s or more, for example, to 10 to 250° C./s, and the amount of heat necessary to turn the platinum-added nickel silicide layer 33 in the $(PtNi)_2Si$ phase formed in the first thermal treatment in the above-mentioned step 3 into the platinum-added nickel silicide layer 33 in the PtNiSi phase is applied.

In addition, in order to increase the thermal conductivity of the thermal treatment atmosphere, it is preferable to carry out the thermal treatment under the normal pressure, filled with an inert gas the thermal conductivity of which is higher than that of nitrogen, for example, a helium (He) gas or neon (Ne) gas, or an ambient gas including nitrogen gas added with an inert gas (He or Ne) the thermal conductivity of which is higher than that of the nitrogen gas.

In the second thermal treatment in step S5, either the soak anneal process (2nd RTA (Soak) in Table 1) or the spike anneal process (2nd RTA (Spike) in Table 1) can be used.

FIG. 22 is a graph diagram for illustrating the temperature characteristic of the soak anneal process and the spike anneal process. The soak anneal process is a thermal treatment method in which after a wafer is raised in temperature up to the thermal treatment temperature, the wafer is kept at the thermal treatment temperature for a predetermined time and then reduced in temperature. The spike anneal process is a thermal treatment in which after a wafer is raised in temperature up to the thermal treatment temperature in a brief time, the wafer is not kept at the thermal treatment temperature (the hold time is zero second) but reduced in temperature, and it is possible to reduce the amount of heat applied to the wafer compared to that in the soak anneal process.

However, as shown in FIG. 22, the heat history is different between the soak anneal process and the spike anneal process, and therefore, it is necessary to set the temperature of the soak anneal process to a temperature different from that of the spike anneal process in the second thermal treatment. As described earlier, if the second thermal treatment is carried out at the temperature at which the lattice constant of $(PtNi)Si_2$ coincides with that of silicon, the $(PtNi)_2Si$ phase higher in resistance than the PtNiSi phase may be formed. Consequently, in the soak anneal process and spike anneal process, it is necessary to carry out the second thermal treatment in a temperature range in which the $(PtNi)_2Si$ phase is not formed.

According to the various experiments conducted by the present inventors, it has been found that the thermal treatment temperature of the spike anneal process needs to be set to a temperature about 30 to 40° C. higher than the thermal treatment temperature of the soak anneal process in order to form the platinum-added nickel silicide layer with the same composition in the platinum-added nickel silicide layer formed by the soak anneal treatment and in the platinum-added nickel silicide layer formed by the spike anneal process. Consequently, when applying the soak anneal process for the second thermal treatment, the thermal treatment temperature was set to 380 to 495° C. and when applying the spike anneal process, the thermal treatment temperature was set to 380 to 525° C.

In the second thermal treatment, if a temperature rise rate of 10 to 250° C./s can be realized, either the lamp heating device or the heater heating device can be used. The thermal treatment temperature of the second thermal treatment is 380° C. or more and a temperature range of 280° C. or less in which the control of the temperature is difficult with the lamp heating device is not used, and therefore, the lamp heating device can also be used.

As described earlier, in the first thermal treatment, it is made possible to control the temperature in a range of 210 to 310° C. using the heater heating device. Further, it is possible to suppress the application of an excessive amount of heat to the wafer by carrying out the thermal treatment of the wafer in an atmosphere using an inert gas the thermal conductivity of which is higher than that of nitrogen using the heater heating device to realize a temperature rise rate of 30 to 250° C./s. With the arrangement, a uniform silicide reaction occurs and it is possible to form the platinum-added nickel silicide layer 33 in the $(PtNi)_2Si$ phase in which the variations in composition are suppressed. Further, in the second thermal treatment, it is possible to suppress the application of an excessive amount of heat to the wafer by realizing a temperature rise rate of 10 to 250° C./s. Consequently, a uniform silicide reaction and a stabilization reaction occur and therefore it is possible to form the platinum-added nickel silicide layer 33 in the PtNiSi phase with few defects on the surface and in which the variations in composition are suppressed. From these results, in the wafer plane, it is possible to form the homogeneous platinum-added nickel silicide layer 33 with a low resistance over the surface of the gate electrode 10n of nMIS and the source/drain diffusion region 16 and over the surface of the gate electrode 10p of pMIS and the source/drain diffusion region 17.

After the platinum-added nickel silicide layer 33 with a low resistance is formed over the surface of the gate electrode 10n of nMIS and the source/drain diffusion region 16 and over the surface of the gate electrode 10p of pMIS and the source/drain diffusion region 17 in this manner, wirings that electrically connect various semiconductor elements formed over the semiconductor substrate 1 are formed besides the CMOS devices.

Figure 23:
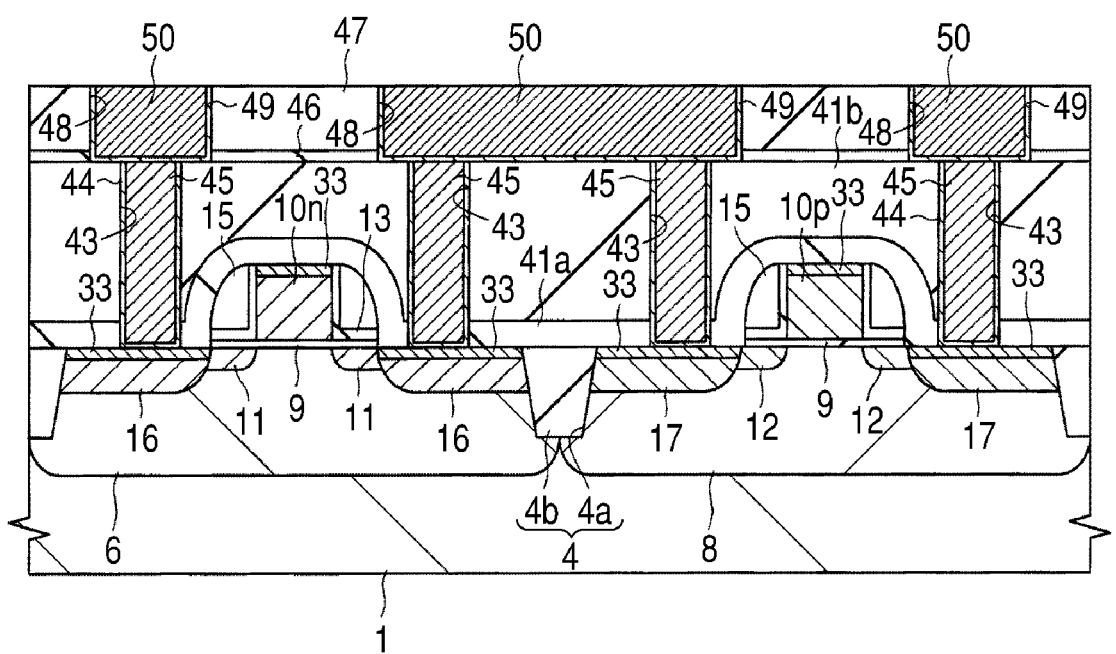
FIG. 23 is a section view of essential parts during the period of manufacture of the CMOS device following FIG. 17.

Next, as shown in FIG. 23, a first insulating film 41a is formed by depositing a silicon nitride film over the main surface of the semiconductor substrate 1 by the plasma CVD method at a film formation temperature (substrate temperature) of about 450° C. This is disclosed in Japanese Patent Application No. 2007-259355 (filed on Oct. 3, 2007) by Murata et al., and therefore, its description is omitted here. Subsequently, a second insulating film 41b is formed by depositing a TEOS (Tetra Ethyl Ortho Silicate) film over the first insulating film 41a by the plasma CVD method and then, an interlayer insulating film including the first and second insulating films 41a, 41b is formed. Then, the surface of the second insulating film 41b is polished by the CMP method. Even if bumps and dips are formed over the surface of the first insulating film 41a resulting from the steps in the backing, the surface of the second insulating film 41b is polished by the CMP method and thereby it is possible to obtain an interlayer insulating film the surface of which has been flattened.

Next, the first and second insulating films 41a, 41b are etched using a resist pattern as a mask and thus a connection hole 43 that reaches the platinum-added nickel silicide layer 33 of nMIS and pMIS is formed in a predetermined part. Subsequently, a barrier metal film 44 is formed over the main surface of the semiconductor substrate 1 by the plasma CVD method at a film formation temperature (substrate temperature) of not less than 440° C. and not more than 460° C. The barrier metal film 44 is, for example, a titanium film, a titanium nitride film, or a laminated film thereof, etc. Further, over the barrier metal film 44, a metal film, for example, a tungsten film is deposited and a plug 45 is formed by flattening the surface of the metal film by, for example, the CMP method, and by embedding the metal film in the connection hole 43. This is disclosed in Japanese Patent Application No. 2006-282100 (filed on Oct. 17, 2006) and Japanese Patent Application No. 2007-158238 (filed on Jun. 15, 2007) by Futase et al., and therefore, its description is omitted here.

Next, a stopper insulating film 46 and a wiring forming insulating film 47 are formed sequentially over the main surface of the semiconductor substrate 1. The stopper insulating film 46 is a film that works as an etching stopper when a groove is processed in the insulating film 47 and a material is used that has an etching selection ratio for the insulating film 47. As the stopper insulating film 46, for example, a silicon nitride film formed by the plasma CVD method can be used and as the insulating film 47, for example, a silicon oxide film formed by the plasma CVD method can be used. In the stopper insulating film 46 and the insulating film 47, a first layer wiring, to be described next, is formed.

Next, a first layer wiring is formed by the single damascene method. First, after a wire groove 48 is formed in a predetermined region of the stopper insulating film 46 and the insulating film 47 by dry etching using a resist pattern as a mask, a barrier metal film 49 is formed over the main surface of the semiconductor substrate 1. The barrier metal film 49 is, for example, a titanium nitride film, a tantalum film, a tantalum nitride film, etc. Subsequently, by the CVD method or sputtering method, a copper seed layer is formed over the barrier metal film 49 and further, a copper plating film is formed over the seed layer using the electrolysis plating method. The interior of the wire groove 48 is embedded with the copper plating film. Subsequently, the copper plating film, the seed layer, and the barrier metal film 49 in the region other than the wire groove 48 are removed by the CMP method and a first layer wiring 50 made of copper as its main conductive material is formed.

Figure 24:
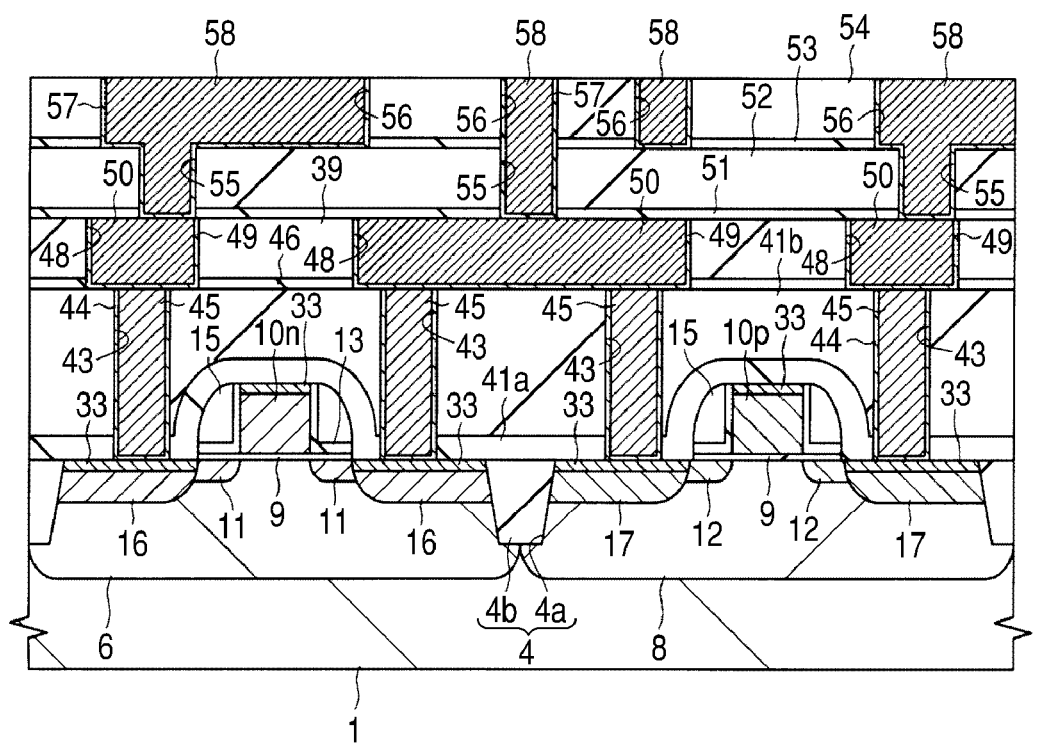
FIG. 24 is a section view of essential parts during the period of manufacture of the CMOS device following FIG. 23.

Next, by the dual damascene method, a second layer wiring is formed. First, as shown in FIG. 24, over the main surface of the semiconductor substrate 1, a cap insulating film 51, an interlayer insulating film 52, and a stopper insulating film 53 for wiring formation are formed sequentially. In the cap insulating film 51 and the interlayer insulating film 52, a connection hole is formed, as will be described later. The cap insulting film 51 is made of a material having an etching selection ratio for the interlayer insulating film 52 and a silicon nitride film formed by, for example, the plasma CVD method can be used. Further, the cap insulating film 51 has a function as a protective film that prevents copper constituting the first layer wiring 50 from diffusing. As the interlayer insulating film 52, a TEOS film formed by, for example, the plasma CVD method can be used. The stopper insulating film 53 is made of an insulating material having an etching selection ratio for the interlayer insulating film 52 and the insulating film for wiring formation to be deposited later in the upper layer of the stopper insulating film 53 and, for example, a silicon nitride film formed by the plasma CVD method can be used.

Next, after processing the stopper insulating film 53 by dry etching using a resist pattern for forming a hole as a mask, an insulating film 54 for wiring formation is formed over the stopper insulating film 53. As the insulating film 54, for example, a TEOS film can be used.

Next, by dry etching using a resist pattern for forming a wire groove as a mask, the insulating film 54 is processed. At this time, the stopper insulating film 53 functions as an etching stopper. Subsequently, by dry etching using the stopper insulating film 53 and a resist pattern for forming a wire groove as a mask, the interlayer insulating film 52 is processed. At this time, the cap insulating film 51 functions as an etching stopper. Subsequently, by removing the exposed cap insulating film 51 by dry etching, a connection hole 55 is formed in the cap insulating film 51 and the interlayer insulating film 52, and a wire groove 56 is formed in the stopper insulating film 53 and the insulating film 54.

Next, a second layer wiring is formed inside the connection hole 55 and the wire groove 56. The second layer wiring is made of a barrier metal layer and a copper film, which is a main conductive layer and a connection material that connects the wiring and the first layer wiring 50, which is a lower layer wiring, is formed integrally with the second layer wiring. First, a barrier metal film 57 is formed over the main surface of the semiconductor substrate 1 including the interior of the connection hole 55 and the wire groove 56. The barrier metal film 57 is, for example, a titanium nitride film, a tantalum film, or a tantalum nitride film, etc. Subsequently, by the CVD method or sputtering method, a copper seed layer is formed over the barrier metal film 57 and further, a copper plating film is formed over the seed layer using the electrolysis plating method. With the copper plating film, the interior of the connection hole 55 and the wire groove 56 is embedded. Subsequently, the copper plating film, the seed layer, and the barrier metal film 57 in the region other than the connection hole 55 and the wire groove 56 are removed by the CMP method and thus a second layer wiring 58 is formed.

Figure 25:
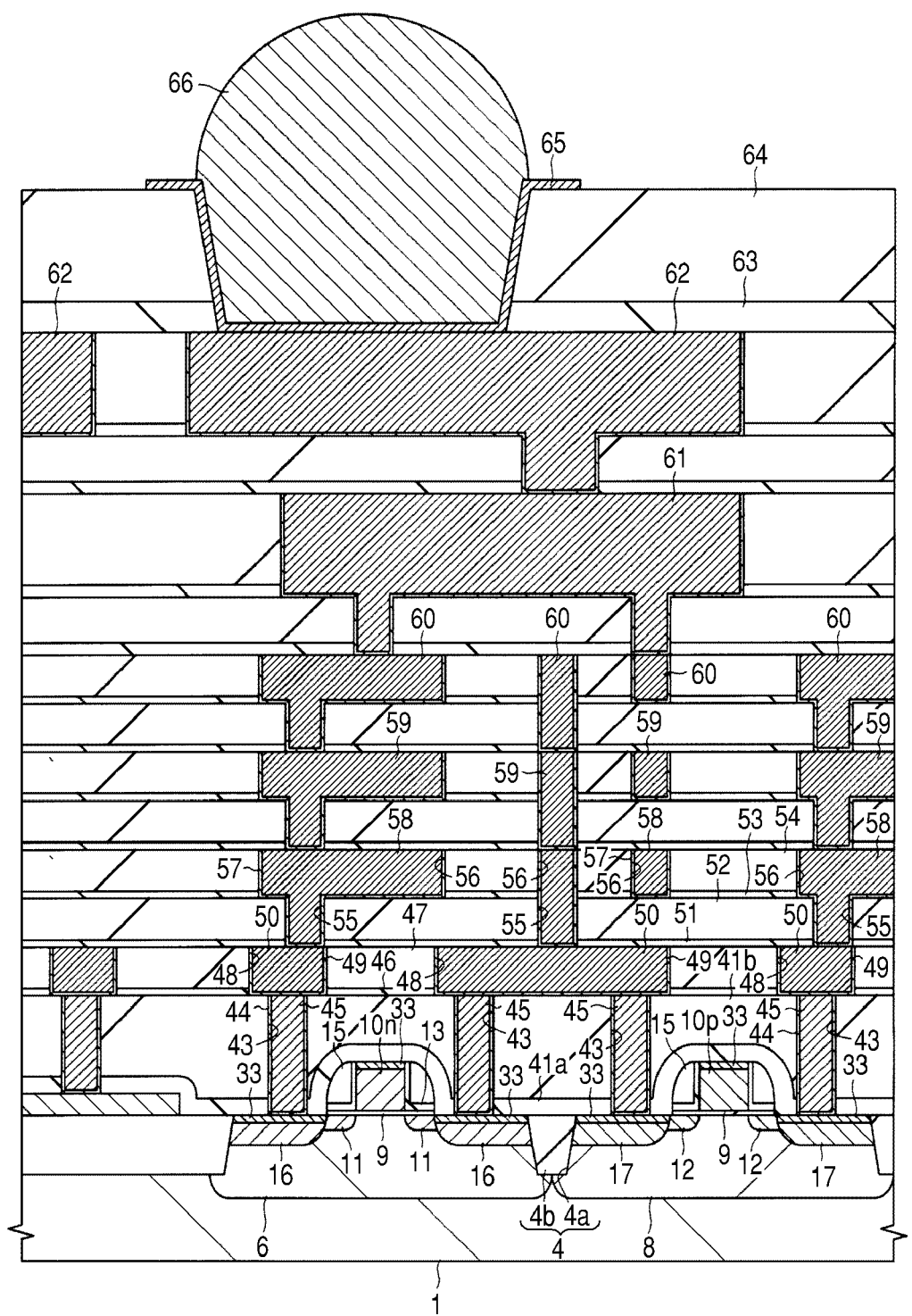
FIG. 25 is a section view of essential parts during the period of manufacture of the CMOS device following FIG. 24.

Then, as shown in FIG. 25, for example, in a manner similar to that of the second layer wiring 58 described above, a wiring in the upper layer is further formed. FIG. 25 shows an example of a CMOS device in which third to sixth layer wirings 59, 60, 61, and 62 are formed. Subsequently, over the sixth layer wiring 62, a silicon nitride film 63 is formed and a silicon oxide film 64 is formed over the silicon nitride film 63. These silicon nitride film 63 and the silicon oxide film 64 function as a passivation film that prevents moisture and impurities from invading from outside and suppresses a rays from transmitting.

Next, by processing the silicon nitride film 63 and the silicon oxide film 64 by etching using a resist pattern as a mask, part of the sixth layer wiring 62 (bonding pad part) is exposed. Subsequently, a bump bottom electrode 65 made of a laminated film of gold film, nickel film, etc., is formed on the exposed sixth layer wiring 62 and a bump electrode 66 made of gold, solder, etc., is formed over the bump bottom electrode 65, and thereby, the CMOS device, which is the first embodiment, is almost completed. The bump electrode 66 works as an electrode for external connection. After this, the semiconductor wafer SW is cut into individual semiconductor chips and mounted on a package substrate etc. and thus a semiconductor device is completed, however, its description is omitted.

As described above, according to the first embodiment, in the wafer plane, the homogeneous platinum-added nickel silicide layer 33 with a low resistance can be formed over the surface of the gate electrode 10n of nMIS and the source/drain diffusion region 16 and over the surface of the gate electrode 10p of pMIS and the source/drain diffusion region 17, and therefore, it is possible to reduce the variations in the electrical characteristic of the platinum-added nickel silicide layer. Consequently, it is possible to improve the reliability of the semiconductor element and its product yield. In addition, in the silicide technique that adopts the thermal treatment in two stages for forming the platinum-added nickel silicide layer 33, the heater heating device is used and the RTA method with a temperature rise rate of 30 to 250° C./s is adopted in the first thermal treatment and the RTA method with a temperature rise rate of 10 to 250° C./s is adopted in the second thermal treatment, and therefore, the platinum-added nickel silicide layer 33 can be formed in a brief time. Consequently, it is possible to improve throughput in the manufacturing process of a CMOS device (semiconductor element) having the platinum-added nickel silicide layer 33.

Second embodiment

A semiconductor device according to a second embodiment resembles that in the first embodiment described above, having a CMOS device in which the platinum-added nickel silicide layer 33 in the PtNiSi phase is formed over the surface of the gate electrode 10n of nMIS and the source/drain diffusion region 16 and over the surface of the gate electrode 10p of pMIS and the source/drain diffusion region 17, but differs from that in the first embodiment described above in the thermal treatment method in the forming process of the platinum-added nickel silicide layer 33. Three divided processes (silicide reaction process, unreacted film removal process, and silicide stabilization process) of the thermal treatment method for forming the platinum-added nickel silicide layer 33 according to the second embodiment will be described below. Conditions of formation of the platinum-added nickel silicide layer 33 in the second embodiment are summarized in Table 3.

TABLE 3

| Metal film | NiPt(8-14 nm) | |
|---|---|---|
| Barrier film | Tin(15 nm) | |
| 1st RTA | 380-400° C. | 30-250° C./s |
| 2nd RTA | Soak: 380-495° C. | 10-250° C./s |
| | Spike: 380-525° C. | 10-250° C./s |

(Silicide Reaction Process)

First, by subjecting the semiconductor substrate 1 over which the nickel-platinum alloy film 18 and the titanium nitride film 19 are deposited sequentially to the first thermal treatment (1st anneal process) using the RTA method (step 3 in FIG. 11), the n-type polycrystalline silicon film 10ns constituting the nickel-platinum alloy film 18 and the gate electrode 10n of nMIS and the single crystal silicon constituting the semiconductor substrate 1 over which the nickel-platinum alloy film 18 and the source/drain diffusion region 16 of nMIS are formed are selectively caused to react with each other to form the platinum-added nickel silicide layer 33 in the PtNiSi phase. Similarly, the p-type polycrystalline silicon film 1ops constituting the nickel-platinum alloy film 18 and the gate electrode 10p of pMIS and the single crystal silicon constituting the semiconductor substrate 1 over which the nickel-platinum alloy film 18 and the source/drain diffusion region 17 of pMIS are formed are selectively caused to react with each other to form the platinum-added nickel silicide layer 33 in the PtNiSi phase.

The temperature of the first thermal treatment in step S3 is thought to be appropriate if it is in a range of, for example, 380 to 400° C. (however, it is obvious that the temperature is not limited to this range under other conditions). As in the first embodiment described above, in the silicide reaction process, the heater heating device 34 described above is used and the temperature rise rate is set to 10° C./s or more, for example, 30 to 250° C./s. Further, it is preferable to carry out the thermal treatment under the normal pressure, filled with an inert gas the thermal conductivity of which is higher than that of nitrogen, for example, a helium gas or neon gas, or an ambient gas including nitrogen gas added with an inert gas the thermal conductivity of which is higher than that of the nitrogen gas in order to improve the thermal conductivity in the atmosphere of the thermal treatment.

As described above, by carrying out the first thermal treatment with a temperature rise rate of 30 to 250° C./s in a thermal treatment atmosphere in which the thermal conductivity is comparatively large using the heater heating device 34, the application of an excessive amount of heat in the silicide reaction temperature range is suppressed and the variations in temperature of the silicide reaction can be controlled. Consequently, in the silicide reaction by the first thermal treatment according to the second embodiment, it is possible to form the platinum-added nickel silicide layer 33 in the PtNiSi phase and to suppress the formation of the platinum-added nickel silicide layer in the mixed phase state where, for example, the (PtNi)Si$_2$ phase, the PtNiSi phase, the (PtNi)$_2$Si phase, the (PtNi)$_3$Si phase, the (PtNi)$_5$Si phase, etc., exist mixedly.

(Unreacted Film Removal Process)

Next, by carrying out a wet cleaning process, the unreacted nickel-platinum alloy film 18 (that is, the nickel-platinum alloy film 18 that has not reacted with the gate electrode 10n of nMIS and the source/drain diffusion region 16 and the gate electrode 10p of pMIS and the source/drain diffusion region 17) and the titanium nitride film 19 are removed (step S4 in FIG. 11). At this time, the nickel silicide layer 33 is left to remain over the surface of the gate electrode 10n of nMIS and the source/drain diffusion region 16 and on the surface of the gate electrode 10p of pMIS and the source/drain diffusion region 17. The wet cleaning process in step S4 can be carried out by the wet cleaning using sulfuric acid, or the wet cleaning using sulfuric acid and hydrogen peroxide solution, etc.

(Silicide Stabilization Process)

Next, by subjecting the semiconductor substrate 1 to the second thermal treatment (2nd anneal process) using the RTA method, the platinum-added nickel silicide layer 33 is stabilized (step S5 in FIG. 11). The thermal treatment temperature of the second thermal treatment in step S5 is set to a thermal treatment temperature higher than that of the first thermal treatment in step S3. That is, the platinum-added nickel silicide layer 33 in the PtNiSi phase is formed by the first thermal treatment in step S3 and the platinum-added nickel silicide layer 33 remains in the PtNiSi phase even after the second thermal treatment in step S5 is carried out, however, by carrying out the second thermal treatment in step S5, the composition of the platinum-added nickel silicide layer 33 is further made uniform and the composition ratio between the metal elements Ni and Si in the platinum-added nickel silicide layer becomes closer to 1:1, that is, the stoichiometric ratio, and therefore, the platinum-added nickel silicide layer 33 can be stabilized.

If the thermal treatment temperature of the second thermal treatment in step S5 is lower than that of the first thermal treatment in step S3, the platinum-added nickel silicide layer 33 hardly changes even if the second thermal treatment in step S5 is carried out and the stabilization effect of the platinum-added nickel silicide layer 33 cannot be expected, and therefore, the thermal treatment temperature of the second thermal treatment in step S5 is set higher than that of the first thermal treatment in step S3.

However, study of the inventors revealed that if the thermal treatment temperature of the second thermal treatment in step S5 is too high, $PtNiSi_2$ is likely to grow abnormally from the platinum-added nickel silicide layer 33 to the channel part because the metal element PtNi constituting the platinum-added nickel silicide layer 33 diffuses excessively due to the second thermal treatment in step S5. It has also revealed that an unwanted $PtNiSi_2$ part is formed and there is a possibility that the electric resistance of the platinum-added nickel silicide layer 33 varies for each pMIS and nMIS.

Therefore, in the second embodiment, the thermal treatment temperature of the second thermal treatment in step S5 is set to a temperature lower than the temperature at which the lattice size (lattice constant) of $PtNiSi_2$ coincides with that of silicon constituting the semiconductor substrate 1. Consequently, when the second thermal treatment in step S5 is carried out, it is possible to suppress or prevent $PtNiSi_2$ from growing abnormally from the platinum-added nickel silicide layer 33 to the channel part and to reduce the variations in the electric resistance of each platinum-added nickel silicide layer 33 by suppressing or preventing the formation of the unwanted $PtNiSi_2$ part. This is disclosed in Japanese Patent Application No. 2007-17554 by Okada et al. (filed on Jul. 3, 2007) and therefore its description is omitted here.

In the second thermal treatment in step S5, in order to prevent the application of an excessive amount of heat to the platinum-added nickel silicide layer 33, the temperature rise rate is set to 10° C./s or more, for example, 10 to 250° C./s.

In addition, in order to increase the thermal conductivity of the thermal treatment atmosphere, it is preferable to carry out the thermal treatment under the normal pressure, filled with an inert gas the thermal conductivity of which is higher than that of nitrogen, for example, a helium gas or neon gas, or an ambient gas including a nitrogen gas added with an inert gas (He or Ne) the thermal conductivity of which is higher than that of the nitrogen gas.

In the second thermal treatment in step S5, either the soak anneal process (2nd RTA (Soak) in Table 3) or the spike anneal process (2nd RTA (Spike) in Table 3) can be used. As in the first embodiment described above, when applying the soak anneal process for the second thermal treatment, the thermal treatment temperature was set to 380 to 495° C. and when applying the spike anneal process, the thermal treatment temperature was set to 380 to 525° C.

In the second thermal treatment, if a temperature rise rate of 10 to 250° C./s can be realized, either the lamp heating device or the heater heating device can be used. The thermal treatment temperature of the second thermal treatment is 380° C. or more and a temperature range of 280° C. or less in which the control of the temperature is difficult with the lamp heating device is not used, and therefore, the lamp heating device can also be used.

After the nickel silicide layer 33 with a low resistance is formed over the surface of the gate electrode 10n of nMIS and the source/drain diffusion region 16 and over the surface of the gate electrode 10p of pMIS and the source/drain diffusion region 17 in this manner, wirings that electrically connect various semiconductor elements formed over the semiconductor substrate 1 are formed besides the CMOS devices.

As described above, according to the second embodiment, by rapidly raising the temperature to a range of 380 to 400° C. using the heater heating device 34 in the first thermal treatment, it is possible to form the platinum-added nickel silicide layer 33 only in the PtNiSi phase, not in a mixed phase state. Further, by subjecting a wafer to a thermal treatment in an atmosphere using an inert gas the thermal conductivity of which is higher than that of nitrogen using the heater heating device, it is possible to realize a temperature rise rate of 30 to 250° C./s to suppress the application of an excessive amount of heat to the wafer. Consequently, a uniform silicide reaction occurs and the platinum-added nickel silicide layer 33 in the PtNiSi phase in which the variations in composition are suppressed can be formed. Further, in the second thermal treatment, it is possible to realize a temperature rise rate of 10 to 250° C./s to suppress the application of an excessive amount of heat to the wafer. Consequently, it is possible to cause the composition of the platinum-added nickel silicide layer 33 in the PtNiSi phase formed by the first thermal treatment to become closer to the stoichiometric composition. Further, it is also possible to form platinum-added nickel silicide layer 33 with few defects on the surface thereof. As a result, it is possible to form the homogeneous platinum-added nickel silicide layer 33 with a low resistance over the surface of the gate electrode 10n of nMIS and the source/drain diffusion region 16 and over the surface of the gate electrode 10p of pMIS and the source/drain diffusion region 17 in the wafer plane. As a result, it is possible to improve the reliability and its product yield of a CMOS device (semiconductor element) having the platinum-added nickel silicide layer 33.

Third Embodiment

A semiconductor device according to a third embodiment, different from that in the first or second embodiment described above, has a CMOS device in which a nickel silicide layer not added with platinum in a NiSi phase is formed over the surface of the gate electrode 10n of nMIS and the source/drain diffusion region 16 and over the surface of the gate electrode 10p of pMIS and the source/drain diffusion region 17. Three divided processes (silicide reaction process, unreacted film removal process, and silicide stabilization process) of a method of forming a nickel silicide layer, in particular, a thermal treatment method of forming a nickel silicide layer according to the third embodiment will be described below. Conditions of formation of the nickel silicide layer in the third embodiment are summarized in Table 4.

TABLE 4

| Metal film | Ni(9 nm) | |
|---|---|---|
| Barrier film | TiN(15 nm) | |
| 1st RTA | 400-430° C. | 3-10° C./s |
| 2nd RTA | Spike: 410-635° C. | 10-250° C./s |

First, over the main surface of the semiconductor substrate 1, a nickel film is deposited by the sputtering method (step S1 in FIG. 11) and a titanium nitride film is deposited thereover sequentially (step S2 in FIG. 11). The nickel film is, for example, about 9 nm thick, and the titanium nitride film is, for example, about 15 nm thick.

In order to form a nickel film and a titanium nitride film, the device 20 for forming a film of a silicide material shown in FIG. 13 described above can be used. The nickel film and titanium nitride film can be formed in the same manner as the nickel-platinum alloy film 18 and the titanium nitride film 19 in the first embodiment described above using the device 20 for forming a film of a silicide material, and therefore, its description is omitted here.

Then, by subjecting the semiconductor substrate 1 to a thermal treatment, a nickel silicide layer in a NiSi phase is formed over the surface of the gate electrode 10n of nMIS and the source/drain diffusion region 16 and over the surface of the gate electrode 10p of pMIS and the source/drain diffusion region 17.

(Silicide Reaction Process)

First, by subjecting the semiconductor substrate 1 over which the nickel film and the titanium nitride film are deposited sequentially to the first thermal treatment (1st anneal process) using the RTA method (step 3 in FIG. 11), the n-type polycrystalline silicon film ions constituting the nickel film and the gate electrode 10n of nMIS and the single crystal silicon constituting the semiconductor substrate 1 over which the nickel film and the source/drain diffusion region 16 of nMIS are formed are selectively caused to react with each other to form a nickel silicide layer in a NiSi phase. Similarly, the p-type polycrystalline silicon film 10p s constituting the nickel film and the gate electrode 10p of pMIS and the single crystal silicon constituting the semiconductor substrate 1 over which the nickel-platinum alloy film 18 and the source/drain diffusion region 17 of pMIS are formed are selectively caused to react with each other to form a nickel silicide layer in a NiSi phase.

In the first thermal treatment in step S3, the thermal treatment is carried out at, for example, 410° C. for 30 seconds. Its temperature rise rate can be set to, for example, 3 to 10° C./s. In the first and second embodiments described above, a nickel-platinum alloy film is used as a silicide material and by subjecting the nickel-platinum alloy film to the thermal treatment at a NiPt phase transformation temperature or by applying an excessive amount of heat in the first thermal treatment, a platinum-added nickel silicide layer in a mixed phase state is formed. In contrast to this, in the third embodiment, a nickel film is used as a silicide material and its Ni phase transformation temperature is relatively as high as 350° C. or more, and therefore, it is possible to form a nickel silicide film in the NiSi phase even if an excessive amount of heat is applied to the nickel film in the first thermal treatment. Consequently, in the third embodiment in which a nickel film is used as a silicide material, although the temperature rise rate needs to be increased, the lamp heating device or the heater heating device can be used in the silicide reaction process in which the first thermal treatment is carried out.

Although not limited in particular, the thermal treatment may be carried out under the normal pressure, filled with an inert gas the thermal conductivity of which is higher than that of nitrogen, for example, a helium gas or neon gas, or an ambient gas including nitrogen gas added with an inert gas (He or Ne) the thermal conductivity of which is higher than that of the nitrogen gas in order to improve the thermal conductivity in the atmosphere of the thermal treatment.

(Unreacted Film Removal Process)

Next, by carrying out a wet cleaning process, the unreacted nickel film (that is, the nickel film that has not reacted with the gate electrode 10n of nMIS and the source/drain diffusion region 16 and the gate electrode 10p of pMIS and the source/drain diffusion region 17) and the titanium nitride film are removed (step S4 in FIG. 11). At this time, the nickel silicide layer is left to remain over the surface of the gate electrode 10n of nMIS and the source/drain diffusion region 16 and over the surface of the gate electrode 10p of pMIS and the source/drain diffusion region 17. The wet cleaning process in step S4 can be carried out by the wet cleaning using sulfuric acid, or the wet cleaning using sulfuric acid and hydrogen peroxide solution, etc.

(Silicide Stabilization Process)

Next, by subjecting the semiconductor substrate 1 to the second thermal treatment (2nd anneal process) using the RTA method, the nickel silicide layer is stabilized (step S5 in FIG. 11). The thermal treatment temperature of the second thermal treatment in step S5 is set to a thermal treatment temperature higher than that of the first thermal treatment in step S3. That is, the nickel silicide layer in the NiSi phase is formed by the first thermal treatment in step S3 and the nickel silicide layer remains in the NiSi phase even if the second thermal treatment in step S5 is carried out, however, by carrying out the second thermal treatment in step S5, the composition of the nickel silicide layer is further made uniform and the composition ratio between the metal elements Ni and Si in the nickel silicide layer becomes closer to 1:1, that is, the stoichiometric ratio, and therefore, the nickel silicide layer can be stabilized. The resistivity of the NiSi phase is lower than that of the $Ni_2Si$ phase and that of the $NiSi_2$ phase and in step S5 and subsequent steps, the nickel silicide layer is maintained in the NiSi phase with a low resistance until the manufacture of the semiconductor device is completed and in the manufactured semiconductor device, the nickel silicide layer continues to have the NiSi phase with a low resistance even in a state where, for example, the semiconductor substrate 1 is segmented into individual semiconductor chips.

If the thermal treatment temperature of the second thermal treatment in step S5 is lower than that of the first thermal treatment in step S3, the nickel silicide layer hardly changes even if the second thermal treatment in step S5 is carried out and the stabilization effect of the nickel silicide layer cannot be expected, and therefore, the thermal treatment temperature of the second thermal treatment is set higher than that of the first thermal treatment in step S3.

However, study of the inventors have revealed that if the thermal treatment temperature of the second thermal treatment in step S5 is too high, $NiSi_2$ is likely to grow abnormally from the nickel silicide layer to the channel part because the metal element Ni constituting the nickel silicide layer diffuses excessively due to the second thermal treatment in step S5. It has also revealed that an unwanted $NiSi_2$ part is formed and there is a possibility that the electric resistance of the nickel silicide layer varies for each pMIS and nMIS.

Therefore, in the third embodiment, the thermal treatment temperature of the second thermal treatment in step S5 is set to a temperature lower than the temperature at which the lattice size (lattice constant) of $NiSi_2$ coincides with that of silicon constituting the semiconductor substrate 1. Consequently, when the second thermal treatment in step S5 is carried out, it is possible to suppress or prevent $NiSi_2$ from growing abnormally from the nickel silicide layer to the channel part and to reduce the variations in the electric resistance of each nickel silicide layer by suppressing or preventing the formation of the unwanted $NiSi_2$ part. This is disclosed in Japanese Patent Application No. 2007-17554 by Okada et al. (filed on Jul. 3, 2007) and therefore its description is omitted here.

In the second thermal treatment in step S5, in order to prevent the application of an excessive amount of heat to the nickel silicide layer, the spike anneal process (2nd RTA (Spike) in Table 4) is used and the temperature rise rate is set to 10° C./s or more, for example, 10 to 250° C./s. If an excessive thermal treatment is applied to the nickel silicide layer in the NiSi phase formed by the first thermal treatment, Ni and Si constituting the nickel silicide layer react with each other and aggregate and defects are caused in the nickel silicide layer.

Figure 26A:
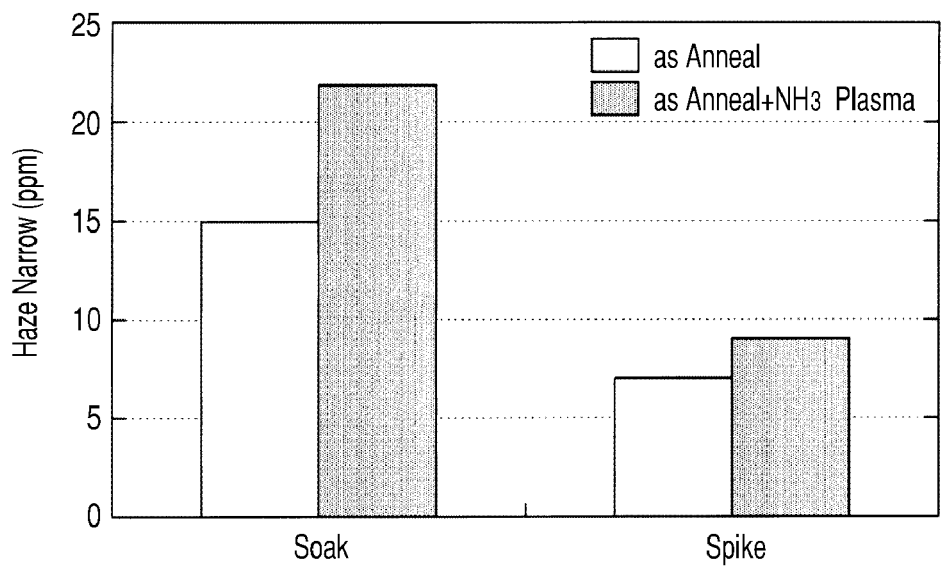
FIG. 26(a) is a graph diagram for illustrating the Haze measurement results of a nickel silicide layer when the second thermal treatment is carried out by the soak anneal process or the spike anneal process by the RTA method according to a third embodiment of the present invention.
Figure 26B:
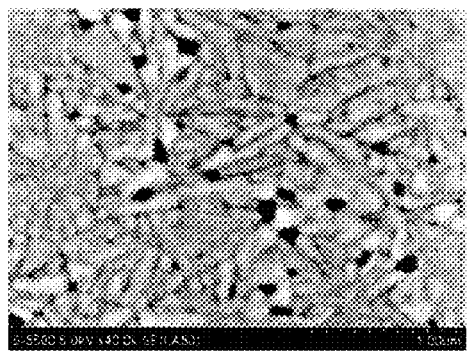
FIGS. 26(b) and 26(c) are SEM photographs of the surface of a nickel silicide layer, respectively, when the second thermal treatment is carried out by the soak anneal process and the spike anneal process by the RTA method according to the third embodiment of the present invention.
Figure 26C:
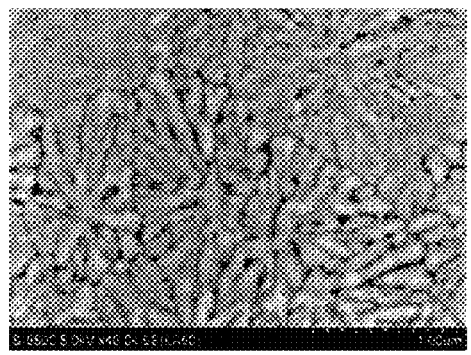

FIG. 26(a) shows a graph diagram for illustrating the Haze (micro-roughness and micro defects on the wafer surface) measurement result in the nickel silicide layer when the second thermal treatment is carried out by the soak anneal process or the spike anneal process by the RTA method. FIGS. 26(b) and 26(c) show SEM (Scanning Electron Microscope) photos of the surface of the nickel silicide layer when the second thermal treatment is carried out by the soak anneal process or the spike anneal process by the RTA method. The specimen is formed by carrying out the first and second thermal treatments after depositing a nickel film over the wafer made of silicon single crystal. The conditions of the first thermal treatment and the method of removing the unreacted film are the same for all of the specimens. FIG. 26(a) shows the Haze measurement result after the second thermal treatment is carried out and the Haze measurement result after a plasma process is carried out using an $NH_3$ gas after the second thermal treatment as well as the specimen having been subjected to the soak anneal process for the second thermal treatment and the specimen having been subjected to the spike anneal process for the second thermal treatment. The conditions of the soak anneal process for the second thermal treatment are that the temperature is 550° C. and the time is 30 seconds and the conditions of the spike anneal process for the second thermal treatment are that the temperature is 590° C. and the time is 30 seconds As shown in FIG. 26(a), it can be seen that the Haze value (Haze narrow) of the specimen having been subjected to the spike anneal process is smaller than that of the specimen having been subjected to the soak anneal process for both the specimens after the second thermal treatment and after the second thermal treatment plus the plasma process, and that the number of bumps and dips or defects on the surface of the nickel silicide layer is smaller in the specimen having been subjected to the spike anneal process than that having been subjected to the soak anneal process. As shown in FIGS. 26(b) and 26(c), it can also be seen that the number of defects in nickel of the specimen having been subjected to the spike anneal process is smaller than that of the specimen having been subjected to the soak anneal process. Consequently, it is possible to suppress the aggregation of NiSi by carrying out the spike anneal process in the second thermal treatment. Further, because the number of defects in the nickel silicide layer is small, it is possible to alleviate damage to the surface of the nickel silicide layer due to plasma even if the plasma process is carried out after the second thermal treatment and the influence of the plasma process can be relaxed.

Figure 27:
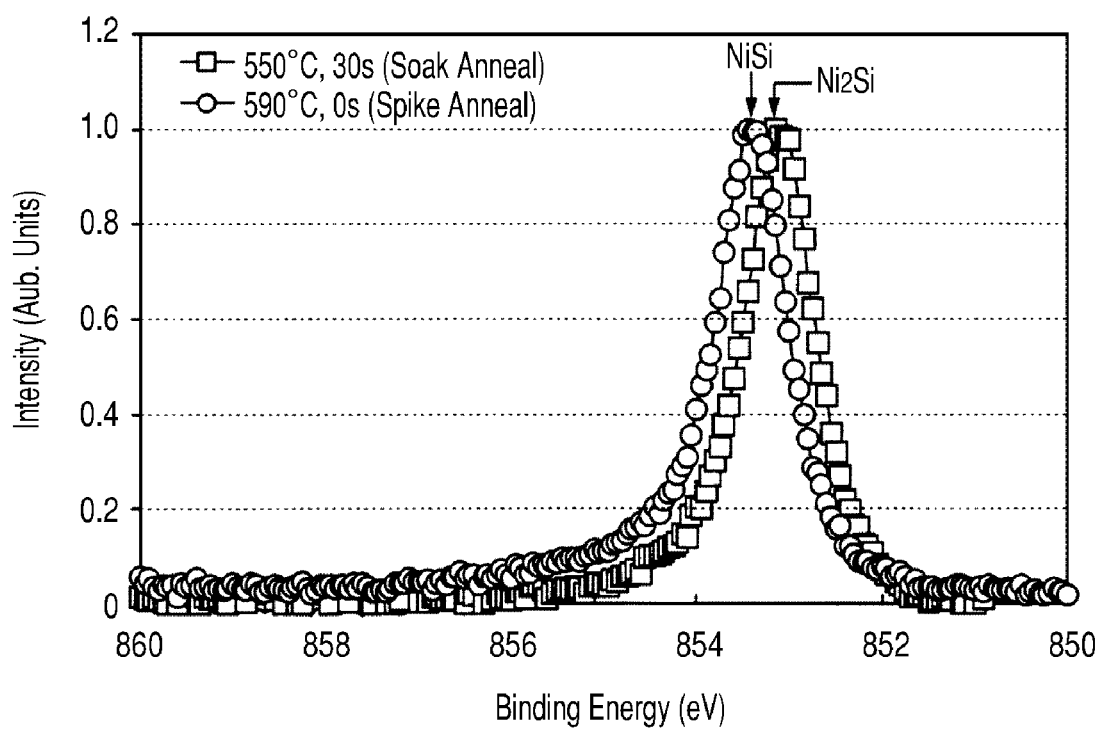
FIG. 27 is a graph diagram for illustrating the XPS measurement results of a nickel silicide layer when the second thermal treatment is carried out by the soak anneal process or the spike anneal process by the RTA method according to the third embodiment of the present invention.

FIG. 27 shows a graph diagram for illustrating the XPS (X-ray Photoelectron Spectroscopy) measurement result of the nickel silicide layer when the second thermal treatment is carried out by the soak anneal process or the spike anneal process by the RTA method. The specimens are the same as those used for the Haze measurement in FIG. 26 described above, however, the plasma process is not carried out. As the composition of the specimen having been subjected to the spike anneal process, the stoichiometric composition of the NiSi phase is obtained, however, the composition of the specimen having been subjected to the soak anneal process is a mixed phase state where phases other than the NiSi phase are mixed.

Based on the Haze measurement and the SEM observation of the nickel silicide layer shown in FIG. 26 and the XPS measurement of the nickel silicide layer shown in FIG. 27, it can be seen that it is possible to suppress the application of an excessive thermal treatment to a wafer, reduce the occurrence of defects in the nickel silicide layer, and form a nickel silicide layer of a mono metal silicide layer with a low resistance, close to the stoichiometric composition.

In addition, in order to increase the thermal conductivity of the thermal treatment atmosphere, it is preferable to carry out the thermal treatment under the normal pressure, filled with an inert gas the thermal conductivity of which is higher than that of nitrogen, for example, a helium gas or neon gas, or an ambient gas including a nitrogen gas added with an inert gas (He or Ne) the thermal conductivity of which is higher than that of the nitrogen gas.

For the specimens used for the Haze measurement and the SEM observation of the nickel silicide layer shown in FIG. 27 described above and used for the XPS measurement of the nickel silicide layer shown in FIG. 27, different thermal treatment temperatures are used in the soak anneal process and the spike anneal process. This is because there is a difference in amount of heat between the soak anneal process and the spike anneal process and there occurs a difference in the thermal treatment temperature.

Figure 28:
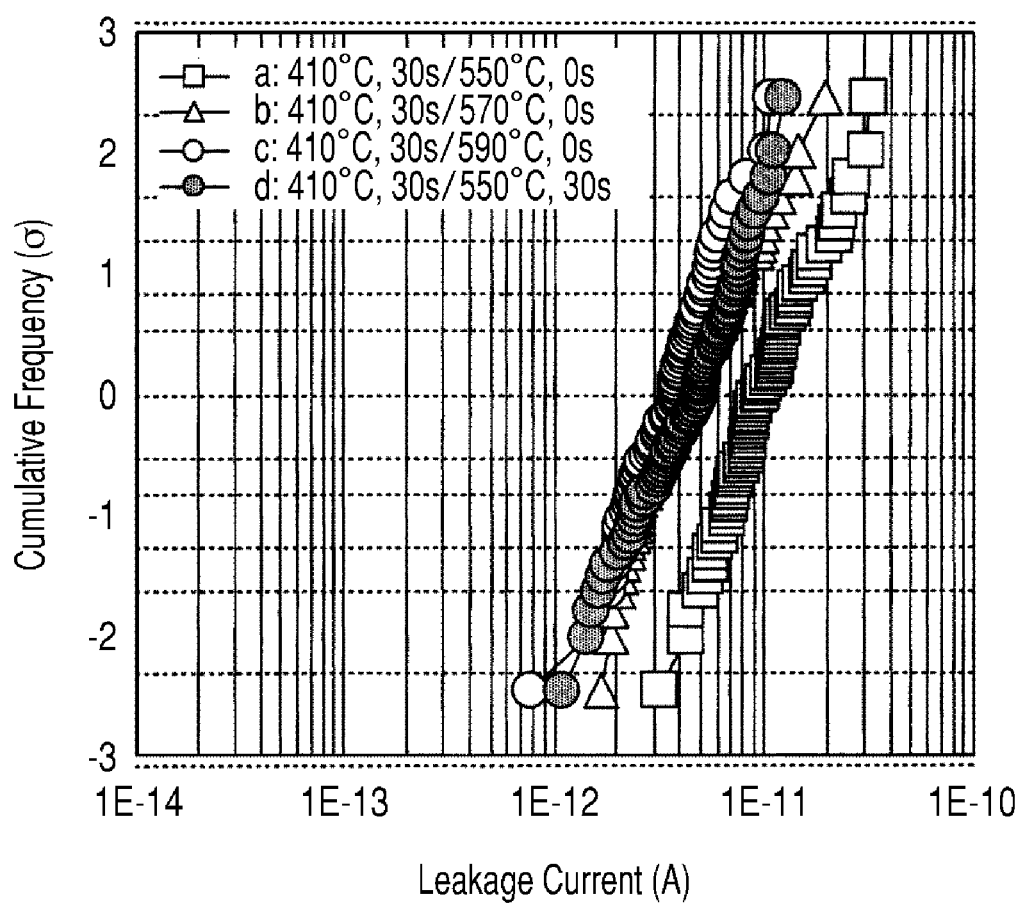
FIG. 28 is a graph diagram for illustrating the leakage current characteristic of a nickel silicide layer when the first thermal treatment is carried out by the soak anneal process and the second thermal treatment is carried out by the soak anneal process or spike anneal process according to the third embodiment of the present invention.

FIG. 28 shows a graph diagram for illustrating the leakage current characteristic of the nickel silicide layer when the first thermal treatment is carried out by the soak anneal process and the second thermal treatment is carried out by the soak anneal process or the spike anneal process. The conditions of the first thermal treatment are the same for all of the specimens (specimens a, b, c and d) and the thermal treatment is carried out by the RTA method at a temperature of 410° C. for 30 seconds. The conditions of the second thermal treatment are that the specimens a, b and c are subjected to the spike anneal process by the RTA method and the specimen d is subjected to the soak anneal process by the RTA method. Further, the temperatures of the second thermal treatment of the specimens a, b and c are different from each another.

As shown in FIG. 28, it can be seen that, if the second thermal treatment is changed from the soak anneal process to the spike anneal process, the leakage current characteristic of the nickel silicide layer by the soak anneal process of the second thermal treatment at a temperature of 550° C. is substantially the same as the leakage current characteristic of the nickel silicide layer by the spike anneal process at a temperature of 590° C.

Figure 29:
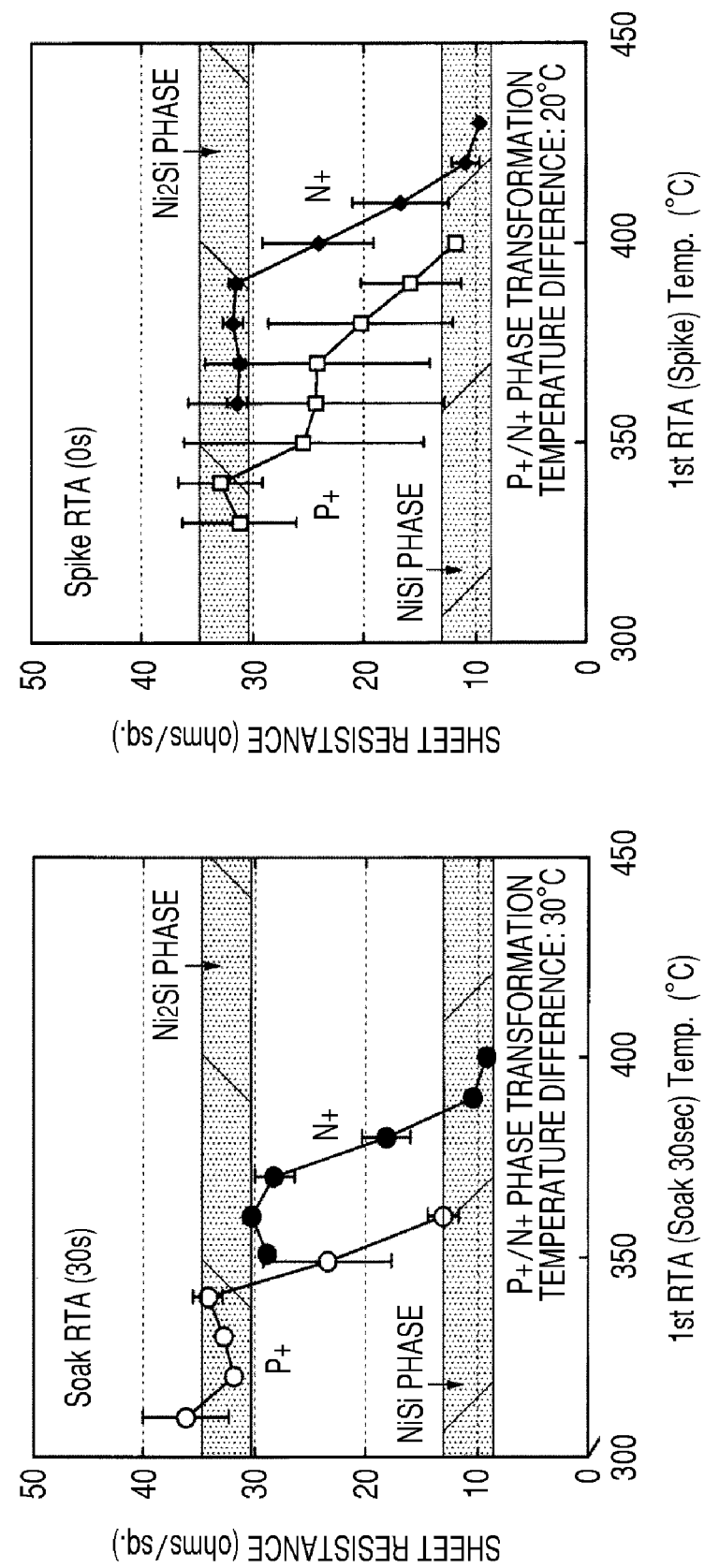
FIG. 29 is a graph diagram for illustrating an example of a relationship between the sheet resistance and the thermal treatment temperature of a nickel silicide layer formed by the soak anneal process and the spike anneal process according to the third embodiment of the present invention.

FIGS. 29(a) and 29(b) each show a graph diagram for illustrating an example of a relationship between the sheet resistance and the thermal treatment temperature of the nickel silicide layer formed by the soak anneal process and the spike anneal process, respectively. The vertical axis in the graph diagram denotes the sheet resistance of the nickel silicide layer formed by being subjected to the respective thermal treatment after a nickel film is deposited over the silicon substrate (N-sub) introduced with n-type impurities (for example, phosphorus or arsenic) and over the silicon substrate (P-sub) introduced with p-type impurities (for example, boron), and the horizontal axis denotes the thermal treatment temperature.

From the difference in sheet resistance, it can be thought that the difference in phase transformation temperature between the nickel silicide layer formed by the soak anneal process and the nickel silicide layer formed by spike anneal process is about 30 to 40° C. Consequently, for the specimens used for the Haze measurement and the SEM observation of the nickel silicide layer shown in FIG. 26 described above and the XPS measurement of the nickel silicide layer shown in FIG. 27, the condition of the temperature of the second thermal treatment by the soak anneal process is set to 550° C. and that of the second thermal treatment by the spike anneal process is set to 590° C.

In the second thermal treatment, if a temperature rise rate of 10 to 250° C./s and the spike anneal process can be realized, any of the lamp heating device and the heater heating device can be used. The thermal treatment temperature of the second thermal treatment is 410° C. or more and a temperature range of 280° C. or less in which the control of the temperature is difficult with the lamp heating device is not used, and therefore, the lamp heating device can also be used.

Table 5 shows an example of a process step diagram of the second thermal treatment to which the spike anneal process is applied. A lamp heating device is used as a thermal treatment device. After the wafer is heated until a temperature zone (about 280° C.) is reached, where the wafer temperature can be read and controlled, the period of time during which the temperature of the wafer is kept at a constant temperature (300° C.) is about 20 to 30 seconds (Steps No. 4, No. 5) and further, the time required until the temperature is raised to the thermal treatment temperature is about 10 seconds (Steps No. 6), and thus, an excessive amount of heat corresponding to the period of time of about 10 seconds is applied to the wafer besides the thermal treatment (0 second). However, if the soak anneal process is applied for the second thermal treatment, an excessive amount of heat is applied for a few seconds besides the thermal treatment (30 seconds) as shown, for example, in Table 6, and therefore, by applying the spike anneal process, it is possible to reduce an excessive amount of heat compared to the case where the soak anneal process is applied.

TABLE 5

| | Step No. | | | | | | |
|---|---|---|---|---|---|---|---|
| | 1 | 2 | 3 | 4 | 5 | 6 | 7 |
| Step Name | PURGE | O2 CHECK | OL | SOR | STAB | RAMP UP | COOLING |
| To Next Step | TIME | O2 < 5 ppm | TEMP > 280 | SETP THERE | TIME | SETP THERE | TIME |
| Time | 20 | 20 | 20 | 5 | 15 | 10 | 20 |
| Setting | CONST. V | CONST. V | RAMP V | RAMP TEMP | STAB TEMP | RAMP TEMP | CONST. V |
| Temp. | 5% | — | — | 280-300 | 300 | 300-590 | 5% |
| Temp Ramp Rate | — | — | 0.1%/s | 5° C./s | — | 20° C./s | — |
| N2 | 15 | 15 | 15 | 15 | 15 | 15 | 15 |
| He | 1.5 | 1.5 | 1.5 | 1.5 | 1.5 | 1.5 | 1.5 |
| Rot. | — | 45 | 240 | 240 | 240 | 240 | 240 |

After the nickel silicide layer with a low resistance is formed over the surface of the gate electrode 10n of nMIS and the source/drain diffusion region 16 and over the surface of the gate electrode 10p of pMIS and the source/drain diffusion region 17 in this manner, wirings that electrically connect various semiconductor elements formed over the semiconductor substrate 1 are formed besides the CMOS devices.

As described above, according to the third embodiment, in the first thermal treatment, the nickel silicide layer in the NiSi phase is formed using the heater heating device or the lamp heating device, and in the second thermal treatment, the application of an excessive amount of heat to the wafer can be suppressed by realizing a temperature rise rate of 10 to 250° C./s. Consequently, in the wafer plane, a uniform silicide reaction occurs on the surface of the gate electrode 10n of nMIS and the source/drain diffusion region 16 and on the surface of the gate electrode 10p of pMIS and the source/drain diffusion region 17 and it is possible to form the nickel silicide layer in the NiSi phase in which the variations in composition are suppressed. As a result, it is possible to improve the reliability of the CMOS device (semiconductor element) and its product yield.

As above, the invention made by the present inventors is described specifically based on the embodiments, however, it is obvious that the present invention is not limited to the above embodiments but various modifications can be made within the scope not departing from its concept.

The present invention is useful for the application to the manufacturing technique of a semiconductor device including a semiconductor element having a metal silicide layer.

What is claimed is:

1. A method of manufacturing a semiconductor device, comprising the steps of:
   (a) preparing a semiconductor substrate made of single crystal silicon;
   (b) forming a semiconductor region over the semiconductor substrate;
   (c) forming an alloy film of nickel and platinum over the semiconductor substrate including the semiconductor region;

(d) forming a platinum-added nickel silicide layer in a (PtNi)2Si phase by carrying out a first thermal treatment to cause the alloy film and the semiconductor region to react with each other;

(e) after step (d), removing the unreacted alloy film over the platinum-added nickel silicide layer in the (PtNi)2Si phase over the semiconductor region; and (f) after step (e), carrying out a second thermal treatment with the thermal treatment temperature higher than that of the first thermal treatment to form the platinum-added nickel silicide layer in a PtNiSi phase, wherein a temperature rise rate of the first thermal treatment in step (d) is 30 to 250° C./s, wherein a temperature rise rate of the second thermal treatment in step (f) is 10° C./s or more, wherein a heater heating method is used for the first thermal treatment in step (d), and wherein the second thermal treatment in step (f) is a spike anneal process.

2. The method of manufacturing a semiconductor device according to claim 1,
wherein the temperature of the first thermal treatment in step (d) is 210 to 310° C.

3. The method of manufacturing a semiconductor device according to claim 1,
wherein the temperature rise rate of the second thermal treatment in step (f) is 10 to 250° C./s.

4. The method of manufacturing a semiconductor device according to claim 1,
wherein the second thermal treatment in step (f) is a soak anneal process.

5. The method of manufacturing a semiconductor device according to claim 4,
wherein the thermal treatment temperature of the second thermal treatment in step (f) is 380 to 495° C./s.

6. The method of manufacturing a semiconductor device according to claim 1,
wherein the thermal treatment temperature of the second thermal treatment in step (f) is 380 to 525° C./s.

7. The method of manufacturing a semiconductor device according to claim 1,
wherein the first thermal treatment in step (d) is carried out in an inert gas having a thermal conductivity higher than that of a nitrogen gas or in a gas atmosphere that is the nitrogen gas added with a gas having the thermal conductivity higher than that of the nitrogen gas.

8. The method of manufacturing a semiconductor device according to claim 7,
wherein the inert gas is helium or neon.

9. The method of manufacturing a semiconductor device according to claim 1,
wherein a heater heating method or a lamp heating method is used for the second thermal treatment in step (f).

10. The method of manufacturing a semiconductor device according to claim 9,
wherein the second thermal treatment in step (f) is carried out in an inert gas having the thermal conductivity higher than that of a nitrogen gas or in a gas atmosphere that is the nitrogen gas added with a gas having the thermal conductivity higher than that of the nitrogen gas.

11. The method of manufacturing a semiconductor device according to claim 10,
wherein the inert gas is helium or neon.

12. The method of manufacturing a semiconductor device according to claim 1,
wherein the semiconductor region is a semiconductor region for a source or drain.

13. The method of manufacturing a semiconductor device according to claim 12, further comprising the steps of:
(a1) after step (a), forming a gate insulating film over the semiconductor substrate; and
(a2) forming a gate electrode made of polycrystalline silicon over the gate insulating film,
wherein, in step (c), the alloy film is formed over the semiconductor substrate including the semiconductor region so as to cover the gate electrode.

14. The method of manufacturing a semiconductor device according to claim 1, further comprising the step of:
(c1) after step (c) and before step (d), forming a barrier film over the alloy film,
wherein, in step (e), the barrier film and the unreacted alloy film are removed.

15. The method of manufacturing a semiconductor device according to claim 1,
wherein the barrier film does not react with the alloy film even if the first thermal treatment is carried out.

16. The method of manufacturing a semiconductor device according to claim 1, further comprising the step of:
(c2) before step (c), dry-cleaning a surface of the semiconductor region in a main surface of the semiconductor substrate,
wherein, after step (c2), step (c) is carried out without exposing the semiconductor substrate to air.

* * * * *